(12) United States Patent
Takahashi

(10) Patent No.: US 10,249,249 B2
(45) Date of Patent: Apr. 2, 2019

(54) SEMICONDUCTOR DEVICE, DISPLAY PANEL, AND ELECTRONIC DEVICE

(71) Applicant: Semiconductor Energy Laboratory Co., Ltd., Atsugi-shi, Kanagawa-ken (JP)

(72) Inventor: Kei Takahashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 48 days.

(21) Appl. No.: 15/447,723

(22) Filed: Mar. 2, 2017

(65) Prior Publication Data

US 2017/0256207 A1 Sep. 7, 2017

(30) Foreign Application Priority Data

Mar. 4, 2016 (JP) .................. 2016-041957

(51) Int. Cl.
*G09G 3/3291* (2016.01)
*G06F 3/041* (2006.01)
(Continued)

(52) U.S. Cl.
CPC ........... *G09G 3/3291* (2013.01); *G06F 3/041* (2013.01); *G09G 3/3233* (2013.01); *G09G 2300/0452* (2013.01); *G09G 2300/0819* (2013.01); *G09G 2300/0842* (2013.01); *G09G 2310/0291* (2013.01); *G09G 2310/08* (2013.01); *G09G 2320/0233* (2013.01); (Continued)

(58) Field of Classification Search
CPC ............ H05B 33/0851; H05B 41/2806; G01S 7/4818
See application file for complete search history.

(56) References Cited

U.S. PATENT DOCUMENTS 5,534,992 A * 7/1996 Takeshima ............ G01S 7/4818
356/5.09
8,487,844 B2 7/2013 Koyama
(Continued)

FOREIGN PATENT DOCUMENTS

JP 2009-265459 A 11/2009

OTHER PUBLICATIONS

Takahashi.K et al., "13.3-inch 8k4k 664-ppi Foldable OLED Display Using Crystalline Oxide Semiconductor FETs", SID Digest '15 : SID International Symposium Digest of Technical Papers, Jun. 2, 2015, pp. 250-253.

*Primary Examiner* — Gerald Johnson
(74) *Attorney, Agent, or Firm* — Robinson Intellectual Property Law Office; Eric J. Robinson

(57) ABSTRACT

A semiconductor device capable of current detection accurately is provided. The semiconductor device includes an error amplifier, a voltage controlled oscillator (VCO), a counter, a first circuit, and a terminal. The terminal is electrically connected to a non-inverting input terminal of the error amplifier. An inverting input terminal of the error amplifier is supplied with first voltage. An output terminal of the error amplifier is electrically connected to the VCO. An output terminal of the VCO is electrically connected to the counter. The first circuit is electrically connected to the output terminal of the VCO and the terminal. The circuit supplies current in accordance with the frequency of a signal output from the VCO.

8 Claims, 20 Drawing Sheets

(51) Int. Cl.
 *G09G 3/3233* (2016.01)
 *H03K 3/037* (2006.01)
 *H03K 21/02* (2006.01)

(52) U.S. Cl.
 CPC ............... *G09G 2320/0295* (2013.01); *G09G 2320/045* (2013.01); *H03K 3/037* (2013.01); *H03K 21/02* (2013.01)

(56) References Cited

U.S. PATENT DOCUMENTS

| | | |
|---|---|---|
| 9,360,704 B2 | 6/2016 | Fukutome |
| 9,659,526 B2 | 5/2017 | Miyake |
| 2005/0043909 A1 | 2/2005 | Poirier et al. |
| 2008/0284720 A1 | 11/2008 | Fukutome |
| 2012/0056537 A1 | 3/2012 | Koyama |
| 2014/0253841 A1 | 9/2014 | Fukutome |
| 2015/0077411 A1 | 3/2015 | Miyake |
| 2016/0126888 A1 | 5/2016 | Okamoto et al. |
| 2016/0155370 A1 | 6/2016 | Kimura |
| 2016/0190331 A1 | 6/2016 | Miyake et al. |
| 2016/0366360 A1 | 12/2016 | Okamoto et al. |
| 2017/0032728 A1 | 2/2017 | Shima et al. |

\* cited by examiner

10a

15

$I = FCV$

224

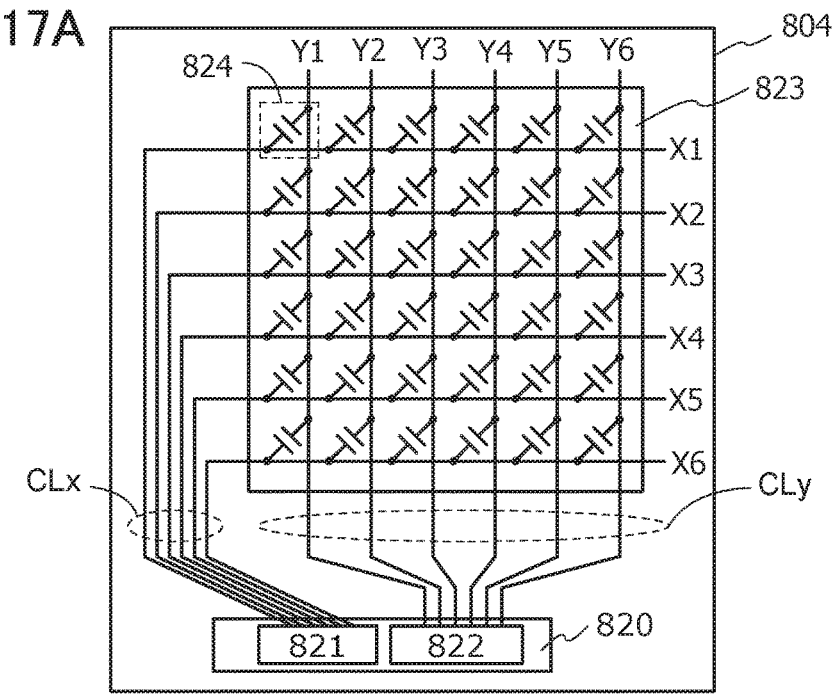
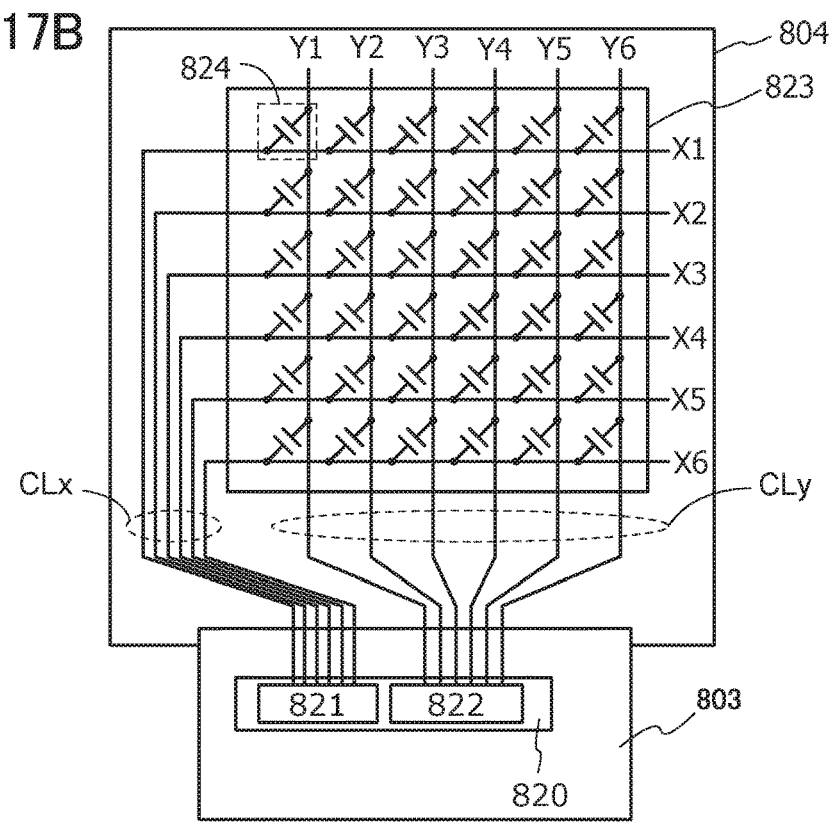

SEMICONDUCTOR DEVICE, DISPLAY PANEL, AND ELECTRONIC DEVICE

BACKGROUND OF THE INVENTION

1. Field of the Invention

One embodiment of the present invention relates to a semiconductor device, a display panel, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, an electro-optical device, a semiconductor circuit, and an electronic device include a semiconductor device in some cases.

2. Description of the Related Art

Various circuit configurations have been proposed for the pixels of active matrix display panels using light-emitting elements such as organic light emitting diodes (OLEDs). In general, a pixel is provided with at least a light-emitting element, a transistor which controls input of a data signal to the pixel, and a transistor which controls a current supplied to the light-emitting element (driving transistor). Supplying drain current flowing through the driving transistor to the light-emitting element enables the light-emitting element to emit light with a luminance corresponding to the value of the drain current. The drain current of the driving transistor is controlled by the voltage of a data signal.

Therefore, in the case where electrical characteristics (e.g., threshold voltage, field-effect mobility) of the driving transistor vary among a plurality of pixels that constitute a screen of a display panel, variations in luminance of the light-emitting element are generated even when data signals with the same voltage are supplied. Variations in electrical characteristics of the driving transistor among a plurality of pixels are one of the causes of reduction in display quality of a display panel.

For active matrix display panels, the number of pixels provided has been increased to achieve higher resolution, and hundreds of thousands to tens of millions of pixels are provided in one display panel. For example, if the resolution is full high definition (full-HD), the number of pixels is 1920×1080=2,073,600; if the resolution is 8K4K (Super Hi-Vision), the number of pixels is 7680×4320=33,177,600. It is very difficult for driving transistors of a large number of different pixels to have perfectly the same electrical characteristics. Thus, measuring the drain current of a driving transistor and compensating the luminance of a light-emitting element is proposed (e.g., Patent Document 1 and Non-Patent Document 1).

REFERENCE

Patent Document

[Patent Document 1]
Japanese Published Patent Application No. 2009-265459

Non-Patent Document

[Non-Patent Document 1]
Kei Takahashi, et al., "13.3-inch 8k4k 664-ppi Foldable OLED Display Using Crystalline Oxide Semiconductor FETs," *SID Symposium Digest, pp.* 252-253, 2015.

SUMMARY OF THE INVENTION

The drain current of the above driving transistor is very small, approximately one nanoampere to several hundreds of nanoamperes. To detect the above drain current accurately, a current detection circuit with little noise is required for a display panel.

Non-Patent Document 1 discloses a current detection circuit using operational amplifiers and a comparator; however, these amplifier circuits are likely to cause variation and noise, and likely to be a factor that reduces the accuracy of drain current detection. For example, an operational amplifier is likely to cause variation and noise due to the impact of offset voltage, slew rate, and the like. For example, a comparator is likely to cause variation and noise due to the impact of offset voltage, an input-output delay, and the like.

An object of one embodiment of the present invention is to provide a semiconductor device capable of detecting large current accurately. An object of one embodiment of the present invention is to provide a display panel with high display quality. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device including an error amplifier, a voltage controlled oscillator (VCO), a counter, a first circuit, and a terminal. The terminal is electrically connected to a non-inverting input terminal of the error amplifier. An inverting input terminal of the error amplifier is supplied with first voltage. An output terminal of the error amplifier is electrically connected to an input terminal of the VCO. An output terminal of the VCO is electrically connected to the counter. The first circuit is electrically connected to the output terminal of the VCO and the terminal. The first circuit has a function of supplying current through the terminal in accordance with the frequency of a signal output from the VCO. The counter has a function of counting the number of pulses of the signal output from the VCO and outputting the number of the pulses.

In the above semiconductor device, the first circuit includes a second circuit, a first switch, a second switch, and a capacitor. The first switch has a function of controlling electrical continuity between the terminal and a first terminal of the capacitor. The second switch has a function of controlling electrical continuity between the first terminal and a second terminal of the capacitor. The second circuit has a function of controlling on and off states of the first switch and the second switch. It is preferable that the second switch be off when the first switch is on, and that the first switch be off when the second switch is on.

One embodiment of the present invention is a display panel including the above semiconductor device. In the display panel, current flowing through a pixel is detected using the semiconductor device, and display data is compensated in accordance with the current flowing through the pixel.

One embodiment of the present invention is a display module including the display panel in the above embodiment and a touch panel.

One embodiment of the present invention is an electronic device including the display panel in the above embodiment and at least one of an operation button, a speaker, and a microphone.

One embodiment of the present invention is a semiconductor wafer including a plurality of any of the above semiconductor devices and a separation region.

One embodiment of the present invention can provide a semiconductor device capable of detecting current accurately. One embodiment of the present invention can provide a display panel with high display quality. One embodiment of the present invention can provide a novel semiconductor device.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:

FIGS. 17A and 17B are schematic views each illustrating a structure example of a touch panel;

DETAILED DESCRIPTION OF THE INVENTION

Figure 1:
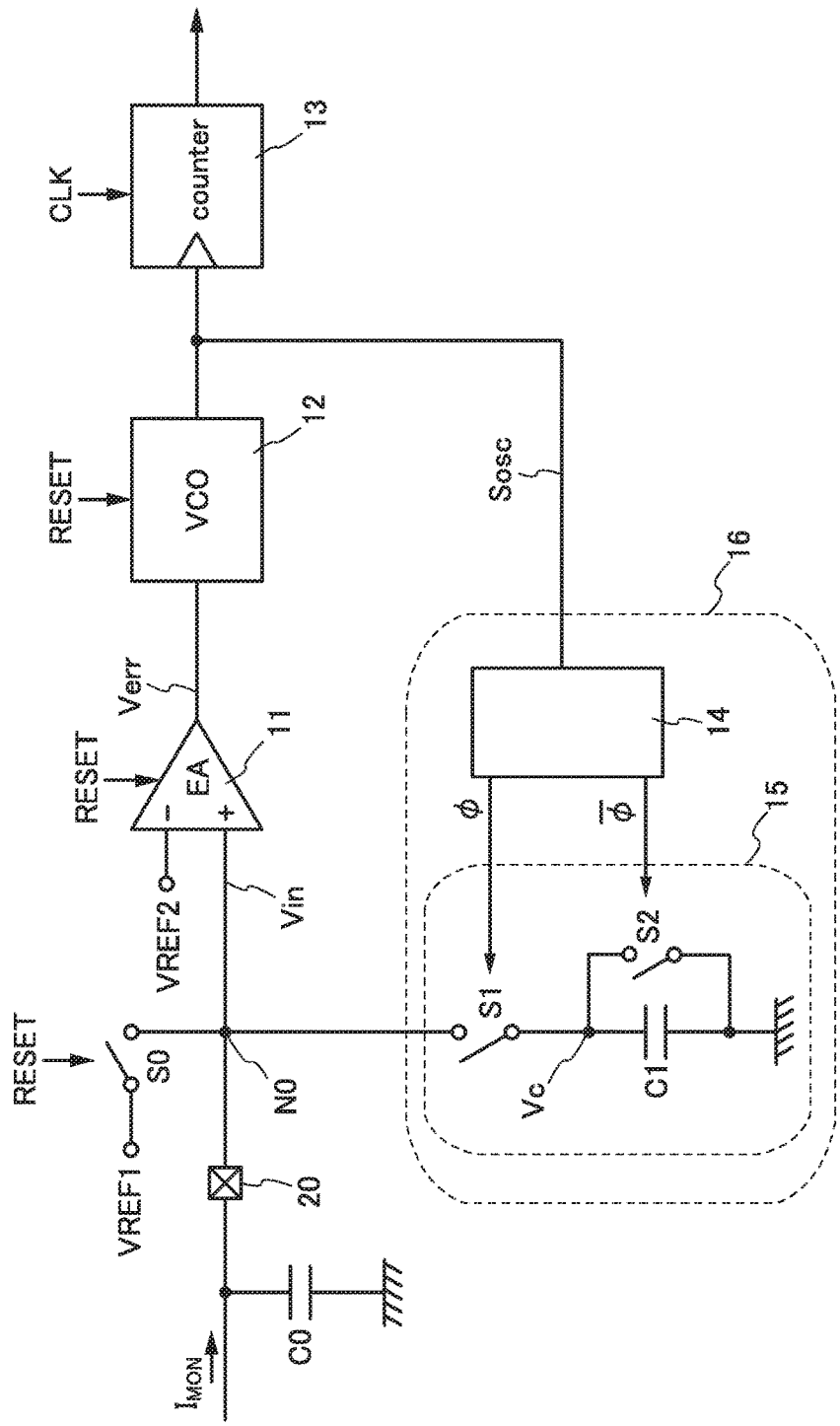
FIG. 1 is a circuit diagram illustrating a structure example of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

The same elements or elements having similar functions, elements formed using the same material, elements formed at the same time, or the like in the drawings are denoted by the same reference numerals, and the description thereof is not repeated in some cases.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification, a high power supply potential is referred to as an H level (or $V_{DD}$), and a low power supply potential is referred to as an L level (or GND), in some cases.

Furthermore, in the present specification, any of the embodiments described below can be combined as appropriate. In addition, in the case where a plurality of structure examples are described in one embodiment, some of the structure examples can be combined as appropriate.

Embodiment 1

In this embodiment, a semiconductor device 10a of one embodiment of the present invention will be described.
<Semiconductor Device 10a>

FIG. 1 is a circuit block diagram illustrating a structure example of a semiconductor device 10a. The semiconductor device 10a includes an error amplifier 11, a VCO 12, a counter 13, a circuit 16, a switch S0, and a terminal 20. The circuit 16 includes a circuit 14 and a circuit 15. The circuit 15 includes a switch S1, a switch S2, and a capacitor C1.

A first terminal of the switch S0 is electrically connected to the terminal 20, and a second terminal of the switch S0 is supplied with voltage VREF1. A non-inverting input terminal (hereinafter referred to as a terminal (+)) of the error amplifier 11 is electrically connected to the terminal 20. An inverting input terminal (hereinafter referred to as a terminal (−)) of the error amplifier 11 is supplied with voltage VREF2. An output terminal of the error amplifier 11 is electrically connected to an input terminal of the VCO12. An output terminal of the VCO12 is electrically connected to the counter 13. The circuit 16 is electrically connected to the output terminal of the VCO12 and the terminal 20.

In the circuit 15, a first terminal of the switch S1 is electrically connected to the terminal 20, and a second terminal of the switch S1 is electrically connected to a first terminal of the capacitor C1. A first terminal of the switch S2 is electrically connected to the first terminal of the capacitor C1, and a second terminal of the switch S2 is electrically connected to a second terminal of the capacitor C1. The second terminal of the capacitor C1 is supplied with GND.

In FIG. 1, a node of the first terminal of the switch S0, the first terminal of the switch S1, and the terminal (+) of the error amplifier 11 is referred to as a node N0.

The semiconductor device 10a has a function of detecting current $I_{MON}$ flowing through an external circuit, and converting the current $I_{MON}$ into a digital signal. The semiconductor device 10a also has a function of converting the current $I_{MON}$ flowing from the terminal 20 into a pulse signal with a specific frequency using the error amplifier 11, the VCO 12, and the circuit 16, and then converting the pulse signal into a digital data using the counter 13.

The capacitor C0 is parasitic capacitance of wirings of the external circuit.

The error amplifier 11 has a function of integrating the difference between voltage Vin on the terminal (+) and the voltage VREF2 of the terminal (−) and outputting the integrated difference as voltage Verr.

The VCO 12 is an oscillator circuit and has a function of controlling the oscillation frequency of an output signal (Sosc) in accordance with the input voltage (Verr). As the VCO 12, for example, a relaxation VCO may be used.

The counter 13 has a function of counting the number of pulses within a period set by a clock signal CLK and outputting the count number.

The circuit 14 has a function of outputting a signal φ and a signal B_φ from the signal Sosc. Note that "B_" in B_φ denotes an overline above φ. The signal φ and the signal B_φ are pulse signals repeatedly vary between an H level and an L level in accordance with the frequency of the signal Sosc. When the signal φ is at an H level, the signal B_φ is always at an L level; conversely, when the signal B_φ is at an H level, the signal φ is always at an L level.

In the circuit 15, the on and off states of the switch S1 are controlled by the signal φ. Specifically, when the signal φ is at an H level, the switch S1 is turned on; when the signal φ is at an L level, the switch S1 is turned off. Similarly, the on and off states of the switch S2 are controlled by the signal B_φ. Specifically, when the signal B_φ is at an H level, the switch S2 is turned on; when the signal B_φ is at an L level, the switch S2 is turned off. The switch S1 and the switch S2 are preferably not turned on at the same time. Therefore, the signal φ and the signal B_φ are preferably not set at an H level at the same time.

<Circuit 15>

Next, the operation of the circuit 15 is described with reference to FIGS. 2A and 2B.

Figure 2A:
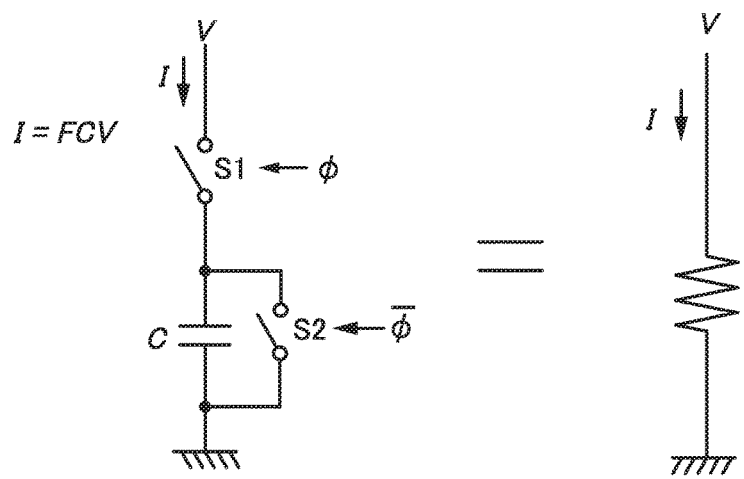
FIG. 2A is a circuit diagram illustrating an operation example of the semiconductor device.
Figure 2B:
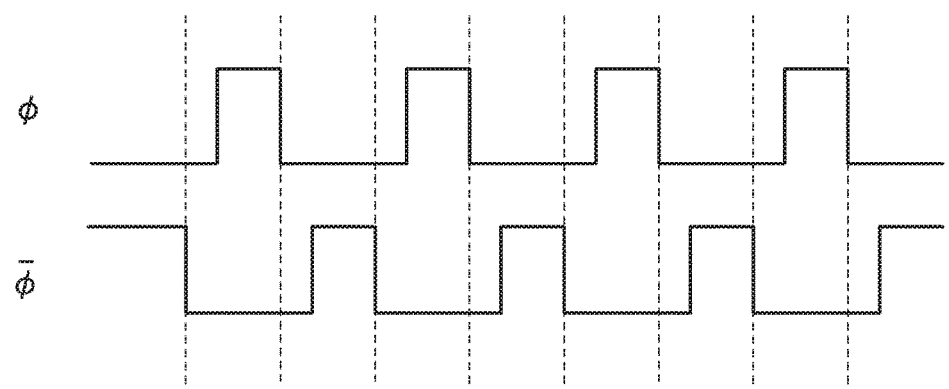
FIG. 2B is a timing chart illustrating an operation example of the semiconductor device.

The capacitance of the capacitor C1 is denoted by C, and voltage V is assumed to be supplied to the first terminal of the switch S1 (see FIG. 2A). Furthermore, the signal φ and the signal B_φ are assumed to be the pulse signals of a frequency F (see FIG. 2B).

The switch S1 and the switch S2 are repeatedly and alternately turned on or off at the frequency F. In other words, the capacitor C1 repeatedly and alternately performs charging and discharging at the frequency F. Here, the circuit 15 is equivalent to a circuit in which the voltage V is supplied to a resistor (see FIG. 2A).

Current I flowing through the circuit 15 is expressed by the following formula.

$$I = FCV \qquad (1)$$

The above formula shows that the circuit 15 supplies current in accordance with the frequency F.

<Operation Example of Semiconductor Device 10a>

Next, the operation of the semiconductor device 10a is described with reference to the timing chart shown in FIG. 3.

Figure 3:
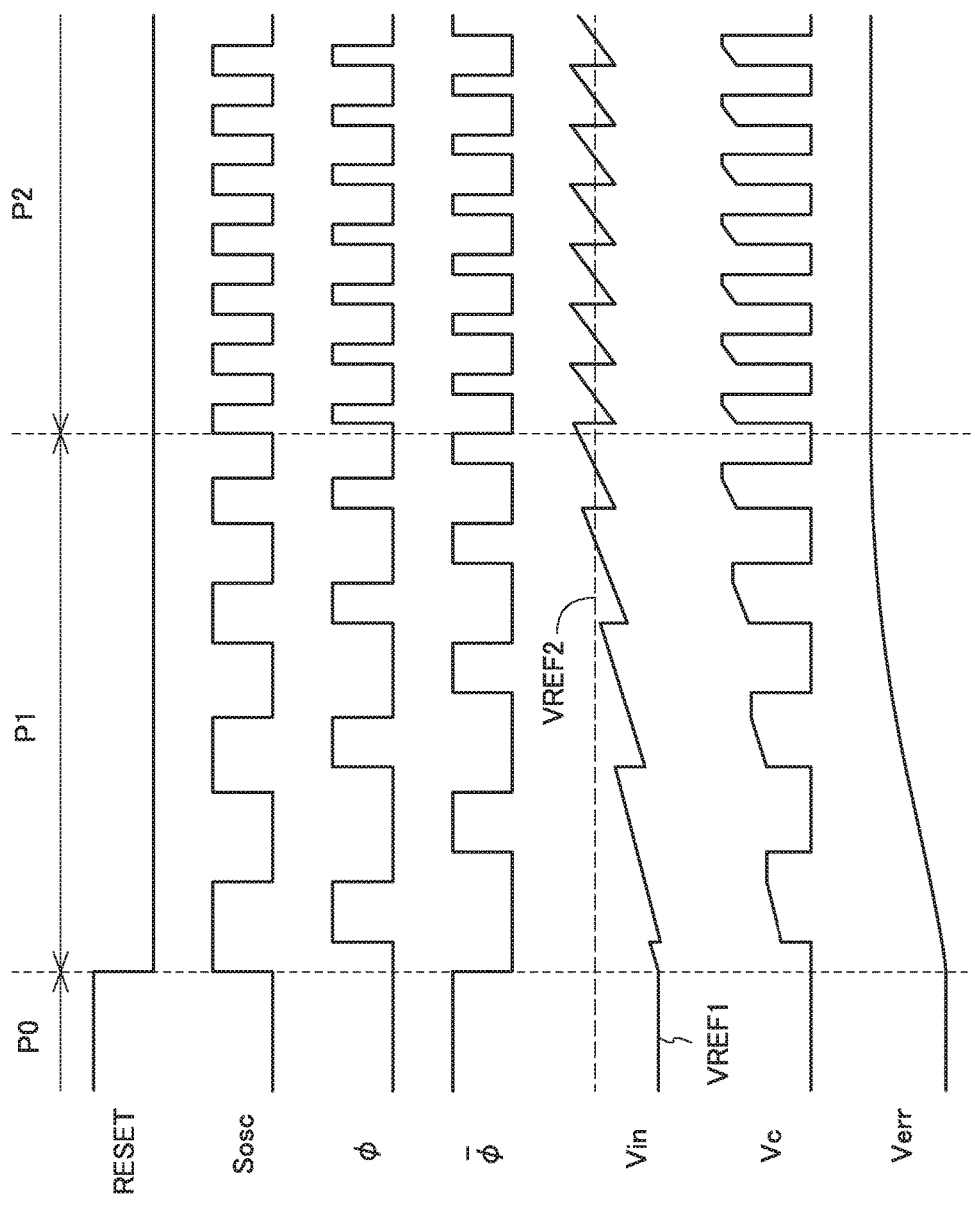
FIG. 3 is a timing chart illustrating an operation example of the semiconductor device.

The timing chart shown in FIG. 3 represents, from the top, each magnitude of the following voltages: a signal RESET, the signal Sosc, the signal φ, the signal B_φ, the voltage Vin, voltage Vc, and the voltage Verr. Note that the voltage Vc refers to the voltage of the first terminal of the capacitor C1.

Furthermore, the timing chart shown in FIG. 3 has three periods: a period P0, a period P1, and a period P2. The period P0 is an initialization period. The period P1 represents a transition period. The period P2 represents a steady period.

First, in the period P0, the signal RESET becomes an H level. Here, the switch S0 is turned on, thereby supplying the node N0 with the voltage VREF1. The voltage Vin becomes the voltage VREF1. The signal RESET is input to the error amplifier 11, and the voltage Verr becomes an L level. Similarly, the signal RESET is input to the VCO12, and the signal Sosc becomes an L level.

Here, the circuit 14 outputs an L level as the signal φ and an H level as the signal B_φ to turn off the switch S1 and turn on the switch S2. The voltage Vc becomes an L level (GND).

Next, in the period P1, the signal RESET becomes an L level and the switch S0 is turned off. In addition, the reset of the error amplifier 11 and the VCO12 is released. The VCO12 starts oscillating and generates a pulse signal as the signal Sosc.

In accordance with the signal Sosc, the circuit 14 generates the signal φ and the signal B_φ which have different timing. The switch S1 and the switch S2 repeatedly and alternately switch between on and off.

Immediately after the switch S1 is turned on and the switch S2 is turned off (i.e., the signal φ becomes an H level and the signal B_φ becomes an L level), charge in the node N0 moves to the capacitor C1, and thus the voltage Vin decreases. Then, the charge moved by the current $I_{MON}$ is stored in the node N0 and the capacitor C1; thus, the voltage Vin and the voltage Vc increase. After that, with the switch S1 being turned off, the charge stops moving to the capacitor C1, and the voltage Vc becomes constant. Because the node N0 is continuously injected with the charge, the voltage Vin continues to increase.

Immediately after the switch S1 is turned off and the switch S2 is turned on (i.e., the signal φ becomes an L level and the signal B_φ becomes an H level), the charge stored in the capacitor C1 is discharged, and the voltage Vc becomes an L level. Because the node N0 is continuously injected with the charge, the voltage Vin continues to increase.

In the initial stage of the period P1, the voltage Verr increases in accordance with the difference between the voltage Vin and the voltage VREF2. When the voltage Verr increases, the frequency of the signal Sosc increases; thus, the frequencies of the signal φ and the signal B_φ also increase. As a result, according to Formula (1), the current flowing through the circuit 15 increases; however, because the current $I_{MON}$ is larger than the current flowing through the circuit 15, the voltage Vc and the voltage Vin increase.

In the late stage of the period P1, the difference between the voltage Vin and the voltage VREF2 becomes small, and the voltage Verr approaches a constant value. As a result, the frequencies of the signal Sosc, the signal φ, and the signal B_φ approach constant values.

In the period P2, there is no difference between the voltage Vin and the voltage VREF2, and the voltage Verr becomes constant. As a result, the frequencies of the signal Sosc, the signal φ, and the signal B_φ become also constant.

The period P2 is a steady period, keeping the voltage of the node N0 at the voltage VREF2. By reading the output value (the digital signal) of the counter 13 at this time, the semiconductor device 10*a* can convert the current $I_{MON}$ into a digital signal.

By the above operation, the semiconductor device 10*a* can detect the current $I_{MON}$ and convert the current $I_{MON}$ into a digital signal. Note that although the voltage VREF1 and the voltage VREF2 are different in the description of this embodiment, the above two voltages may be the same.

For example, in the case where the current $I_{MON}$ is drain current flowing through the driving transistor of a display panel, by driving the semiconductor device 10*a* in the above-described manner, the semiconductor device 10*a* can detect the current $I_{MON}$, with the voltage of the node N0 kept to be the voltage VREF2. In other words, the drain current is detected with the same voltage (e.g., the voltage between a drain and source, or the voltage between a gate and a source) always supplied to the driving transistor; thus, more accurate detection and small variation is possible.

<Circuit 14>

Next, a structure example and an operation example of the circuit 14 are described with reference to FIGS. 4A and 4B.

Figure 4A:
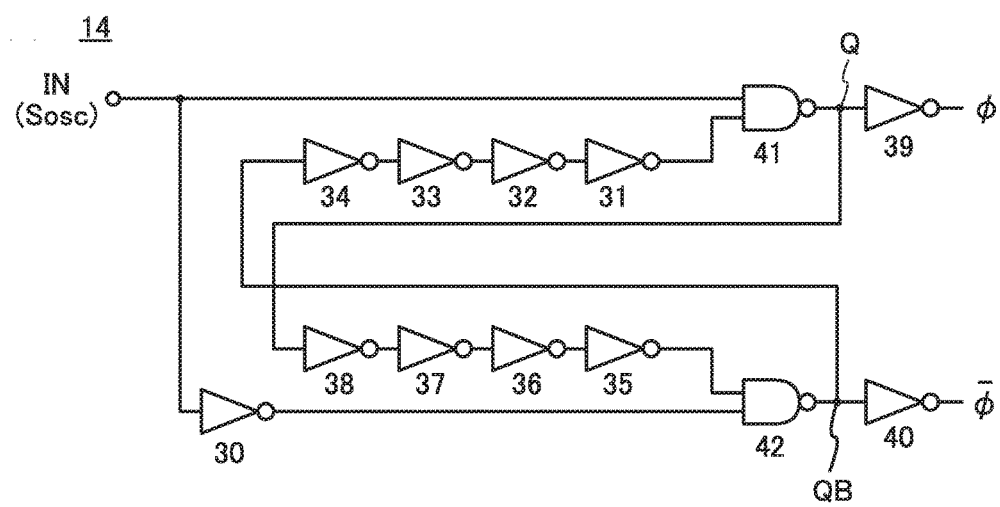
FIG. 4A is a circuit diagram illustrating a structure example of the semiconductor device.

FIG. 4A is a circuit diagram illustrating the structure example of the circuit 14. The circuit 14 includes inverters 30 to 40, a NAND 41, and a NAND 42. Note that an output terminal of the NAND 41 is referred to as a node Q, and that an output terminal of the NAND42 is referred to as a node QB.

The circuit 14 has a function of generating the signal φ and the signal B_φ from the signal Sosc input from a terminal IN.

The circuit 14 is a flip-flop circuit. The circuit 14 includes inverter chains (inverters 31 to 34 and inverters 35 to 38) to provide dead time between the pulse of the signal φ and the pulse of the signal B_φ. The circuit 14 shown in FIG. 4A includes an inverter chain with four stages but is not limited thereto; the circuit 14 may include an inverter chain with a given even number of stages.

Figure 4B:
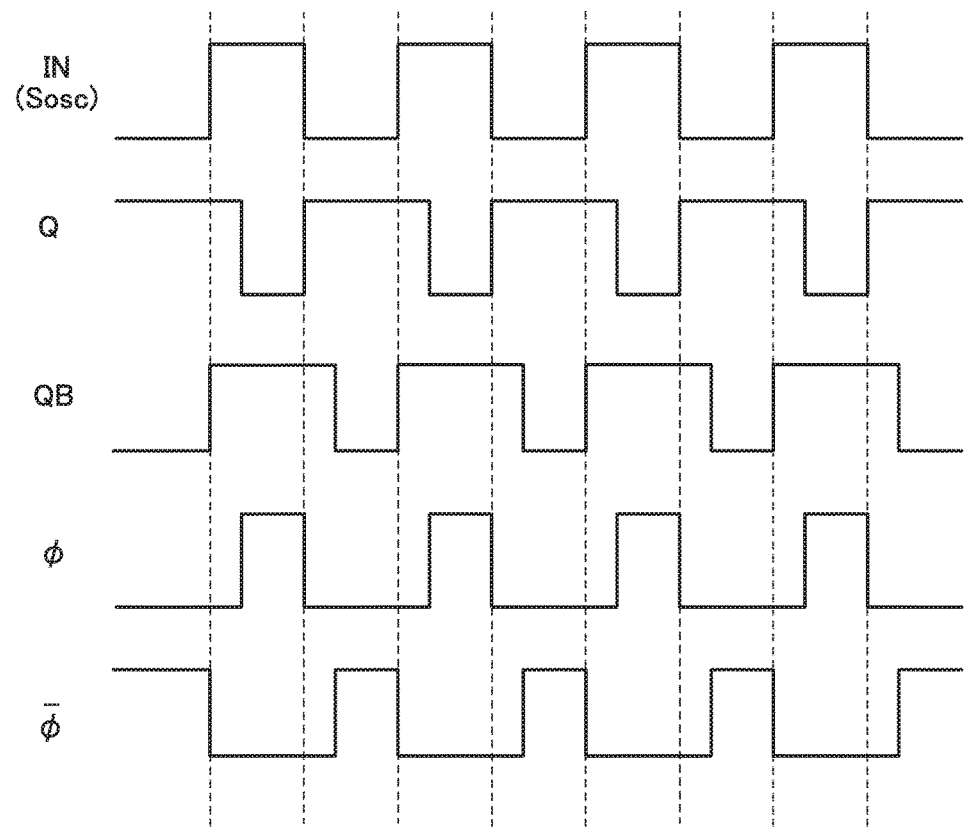
FIG. 4B is a timing chart illustrating an operation example of the semiconductor device.

FIG. 4B is a timing chart illustrating the operation example of the circuit 14. From the top, it shows the voltages of the terminal IN (the signal Sosc), the node Q, the node QB, the signal φ, and the signal B_φ.

As shown in FIG. 4B, dead time is provided between the pulse of the signal φ and the pulse of the signal B_φ. This prevents the switch S1 and the switch S2 from being turned on at the same time, and prevents the semiconductor device 10*a* from malfunctioning.

Because the only amplifier circuit in the semiconductor device 10*a* is the error amplifier 11, the impact of variation and noise on the semiconductor device 10*a* is smaller than that on a current detection circuit with a plurality of amplifier circuits. Therefore, the semiconductor device 10*a* can detect current accurately.

Embodiment 2

In this embodiment, the case where the semiconductor device 10*a* described in Embodiment 1 is used as the driver circuit of a display panel is described.

<Display Panel>

Figure 5:
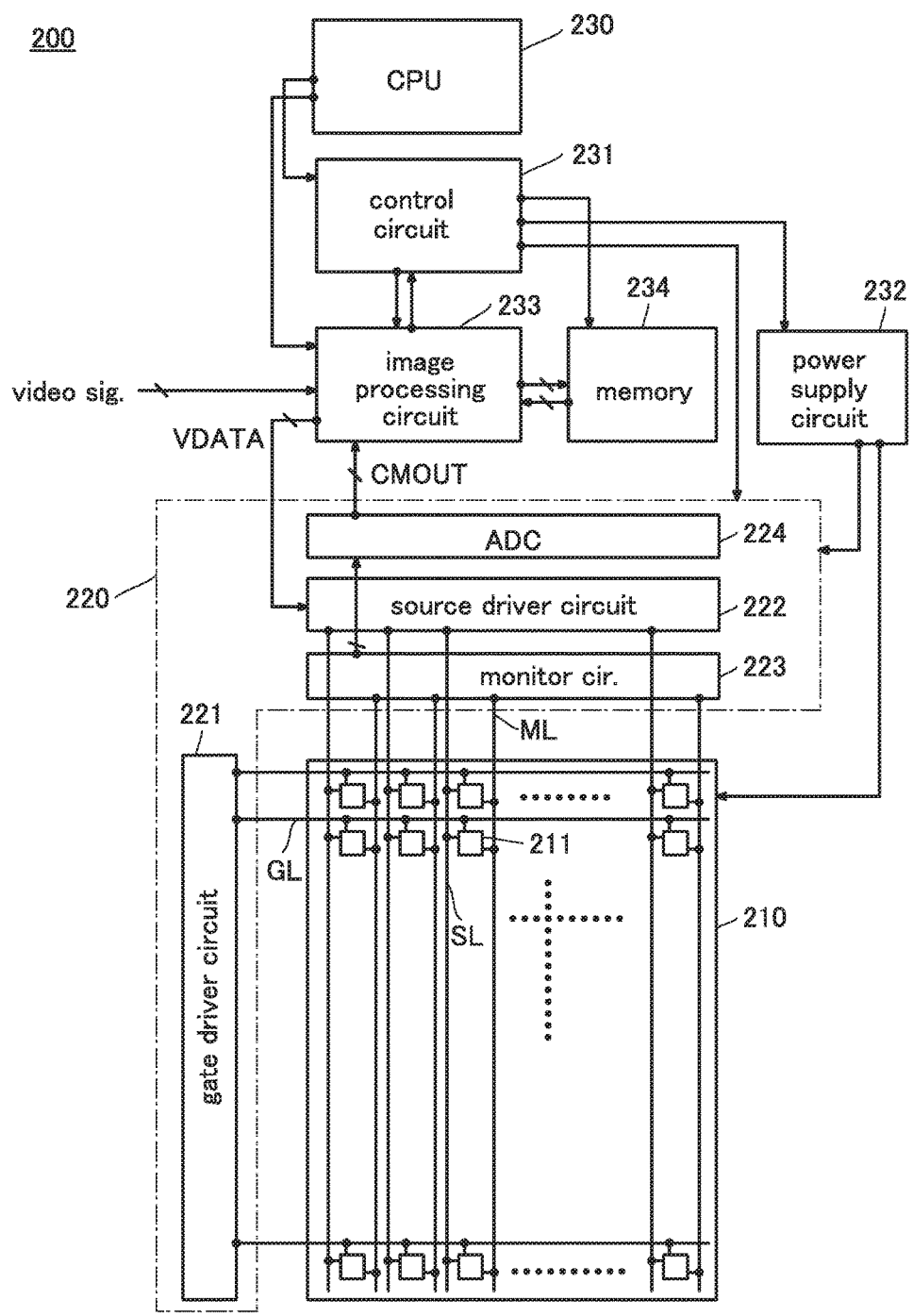
FIG. 5 is a block diagram illustrating a structure example of a display panel.

FIG. 5 is a block diagram illustrating a structure example of a display panel 200. The display panel 200 includes a pixel portion 210, a peripheral circuit 220, a CPU 230, a control circuit 231, a power supply circuit 232, an image processing circuit 233, and a memory 234.

The CPU 230 is a circuit for executing an instruction and controlling the display panel 200 collectively. The CPU 230 executes an instruction input from the outside and an instruction stored in an internal memory. The CPU 230 generates signals for controlling the control circuit 231 and the image processing circuit 233. On the basis of a control signal from the CPU 230, the control circuit 231 controls the operation of the display panel 200. The control circuit 231 controls the peripheral circuit 220, the power supply circuit 232, the image processing circuit 233, and the memory 234 so that the process determined by the CPU 230 is executed. To the control circuit 231, for example, a variety of synchronization signals which determine timing of updating the screen are input. Examples of the synchronization signals include a horizontal synchronization signal, a vertical synchronization signal, and a reference clock signal. The control circuit 231 generates control signals of the peripheral circuit 220 from these signals. The power supply circuit 232 has a function of supplying power supply voltage to the pixel portion 210 and the peripheral circuit 220.

The pixel portion 210 includes a plurality of pixels 211, a plurality of wirings GL, a plurality of wirings SL, and a plurality of wirings ML. The plurality of pixels 211 are provided in a matrix. The plurality of wirings GL, SL, and ML are provided in accordance with the arrangement of the plurality of pixels 211. The wirings GL are arranged in a vertical direction. The wirings SL and ML are arranged in a horizontal direction. The wiring GL is also referred to as a gate line, a scan line, a selection signal line, or the like. The wiring SL is also referred to as a source line, a data line, or the like. The wiring ML is provided to monitor the pixels 211, and can be referred to as a monitor wiring, for example.

The peripheral circuit 220 includes a gate driver circuit 221, a source driver circuit 222, a monitor circuit 223, and an analog-to-digital conversion circuit (ADC) 224.

The gate driver circuit 221 is a circuit for driving the wiring GL and has a function of generating a signal supplied to the wiring GL. The source driver circuit 222 is a circuit for driving the wiring SL and has a function of generating a signal supplied to the wiring SL. The monitor circuit 223 has a function of detecting an analog signal flowing through the wiring ML. The ADC 224 is a circuit for converting an analog signal output from the monitor circuit 223 to a digital signal. The signal CMOUT is an output signal of the ADC 224 and is also a digital signal. The signal CMOUT is input to the image processing circuit 233. Here, the semiconductor device 10*a* in Embodiment 1 is used for the ADC 224.

The image processing circuit 233 has a function of processing a video signal input from the outside and generating a data signal VDATA. The data signal VDATA is a digital signal that represents a gray scale. Furthermore, the image processing circuit 233 has a function of compensating the data signal VDATA using the signal CMOUT. The source driver circuit 222 has a function of processing the data signal VDATA and generating a data signal supplied to each wiring SL. The memory 234 is provided to store data needed for performing processing in the image processing circuit 233. The signal CMOUT, the data signal VDATA, or a video signal input from the outside is stored in the memory 234, for example.

The display panel 200 is described below, assuming that the resolution in a direction parallel to the wiring GL of the pixel portion 210 is n×RGB and that the resolution in a direction parallel to the wiring SL is m. Note that n and m each are an integer of 2 or more. RGB (red, green, and blue) represents colors displayed in the pixels 211. Here, three (RGB) pixels 211 (sub-pixels) form one unit pixel.

Note that the structure of the unit pixel is not limited thereto. The number of sub-pixels, the light-emitting colors of the sub-pixels, the arrangement of the sub-pixels in the unit pixel, and the like can be set as appropriate. For example, in the case where four sub-pixels form one unit pixel, a combination of colors to be displayed can be red (R), green (G), blue (B), and yellow (Y) or red (R), green (G), blue (B), and white (W). In this specification and the like, in the case where the components are distinguished by colors displayed in the pixel, an identification sign such as "_R", "[R]", or "R[1]" is added. For example, a pixel 211_R represents a red pixel 211. Furthermore, a wiring SL_G[2] represents a wiring SL in the second column electrically connected to the pixel 211_G.

<Pixel>

Figure 6A:
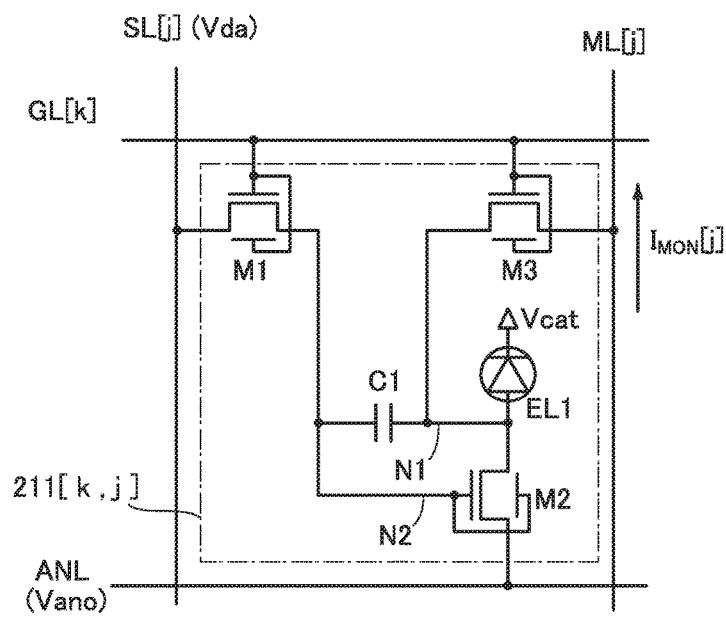
FIG. 6A is a circuit diagram illustrating a structure example of a pixel.
Figure 6B:
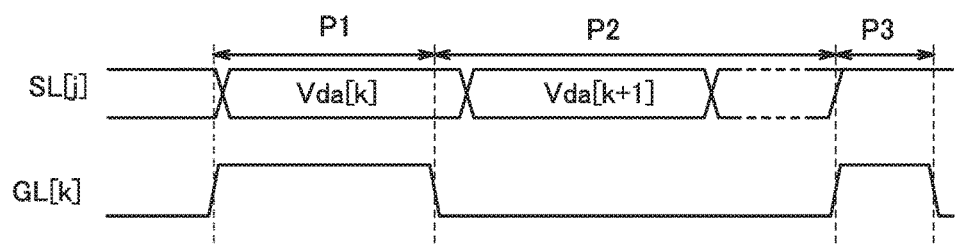
FIG. 6B is a timing chart illustrating an operation example of the pixel.

FIG. 6A is a circuit diagram showing an example of the pixel 211, and FIG. 6B is a timing chart showing an operation example of the pixel 211 in FIG. 6A.

FIG. 6A shows the pixel 211 arranged in the k-th row and the j-th column (k is an integer of 1 or more and m or less and j is an integer of 1 or more and n or less). The pixel 211 is electrically connected to wirings GL, SL, ML, and ANL. The pixel 211 includes transistors M1, M2, and M3, a capacitor C1, and a light-emitting element EL1.

The light-emitting element EL1 includes a pair of terminals (an anode and a cathode). As the light-emitting element EL1, an element which can control the luminance with current or voltage can be used. The light-emitting element EL1 preferably includes an electroluminescence (EL) layer. The EL layer is formed using a single layer or a plurality of layers between the anode and the cathode. The EL layer includes at least a layer containing a light-emitting substance (light-emitting layer).

Although FIG. 6A illustrates the case where the transistors M1 to M3 are n-channel transistors as an example, this embodiment is not limited thereto; some or all of the transistors M1 to M3 may be p-channel transistors. The transistors M1 to M3 each include a back gate electrically connected to a gate. With such a device structure, the current drive capability of the transistors M1 to M3 can be improved. Note that some or all of the transistors M1 to M3 may be transistors which do not include back gates.

The transistor M1 is a pass transistor which connects a gate of the transistor M2 (a node N2) and the wiring SL. The transistor M3 is a pass transistor which connects the wiring ML and an anode of the light-emitting element EL1 (a node N1). The transistor M2 is a driving transistor and functions as a current source of current supplied to the light-emitting element EL1. In accordance with the amount of drain current of the transistor M2, the luminance of the light-emitting element EL1 is adjusted. The capacitor C1 is a storage capacitor which stores voltage between the node N1 and the node N2.

<Operation Example>

The data signal $V_{da}$ is input to the wiring SL. The voltage value of the data signal $V_{da}$ corresponds to the gray scale of the video signal. In FIGS. 6A and 6B, Vda[k] and Vda[k+1] represent the data signals Vda input to the k-th pixel 211 and the (k+1)-th pixel 211, respectively. Vano represents a potential supplied to the wiring ANL, and Vcat represents a potential supplied to the cathode of the light-emitting element EL1.

A period P1 is a writing operation period and the light-emitting element EL1 does not emit light during the period. The wiring ML is electrically connected to a power supply line supplying potential V0. The wiring GL is set at an H level to turn on the transistors M1 and M3. The potential of the wiring SL is supplied to the node N2, so that the drain current having a value corresponding to the potential flows in the transistor M2.

During the period P1, the potential V0 of the wiring ML is preferably lower than the sum of Vcat and the threshold voltage Vthe of the light-emitting element EL1, and Vano is preferably higher than V0. With the above structure, the drain current of the transistor M2 can flow through the wiring ML ahead of the light-emitting element EL1.

A period P2 is a light emission period and the light-emitting element EL1 emits light during the period. An L level potential is supplied to the wiring GL, and the transistors M1 and M3 are turned off. When the transistor M1 is turned off, the data signal Vdata is held at the node N1. Vano is preferably higher than the sum of Vcat and Vthe. By providing the potential difference between the wiring ANL and the cathode of the light-emitting element EL1, the light-emitting element EL1 emits light.

A period P3 is a monitor period in which the drain current of the transistor M2 is obtained. An H level potential is supplied to the wiring GL, and the transistors M1 and M3 are turned on. The wiring SL is supplied with a potential for turning on the transistor M2. The potential of the wiring ML is preferably lower than the sum of Vcat and Vthe, and Vano is preferably higher than the potential of the wiring ML. With the above structure, the drain current of the transistor M2 can flow through the wiring ML with precedence.

Current $I_{MON}$ output from the pixel 211 to the wiring ML in the period P3 corresponds to the drain current flowing through the transistor M2 during the light emission period. The current $I_{MON}$ is analyzed and the voltage of the data signal Vda is compensated on the basis of the analyzation result, whereby the deviation of the luminance of the pixel 211 can be compensated.

The monitor operation is not necessarily performed after the light-emitting operation. For example, in the pixel 211, the monitor operation can be performed after the cycle of data writing operation and light-emitting operation is repeated plural times. Alternatively, after the monitor operation, the light-emitting element EL1 may be brought into a non-light-emitting state by writing a data signal corresponding to the lowest grayscale level [0] to the pixel 211.

<Monitor Circuit>

Figure 7A:
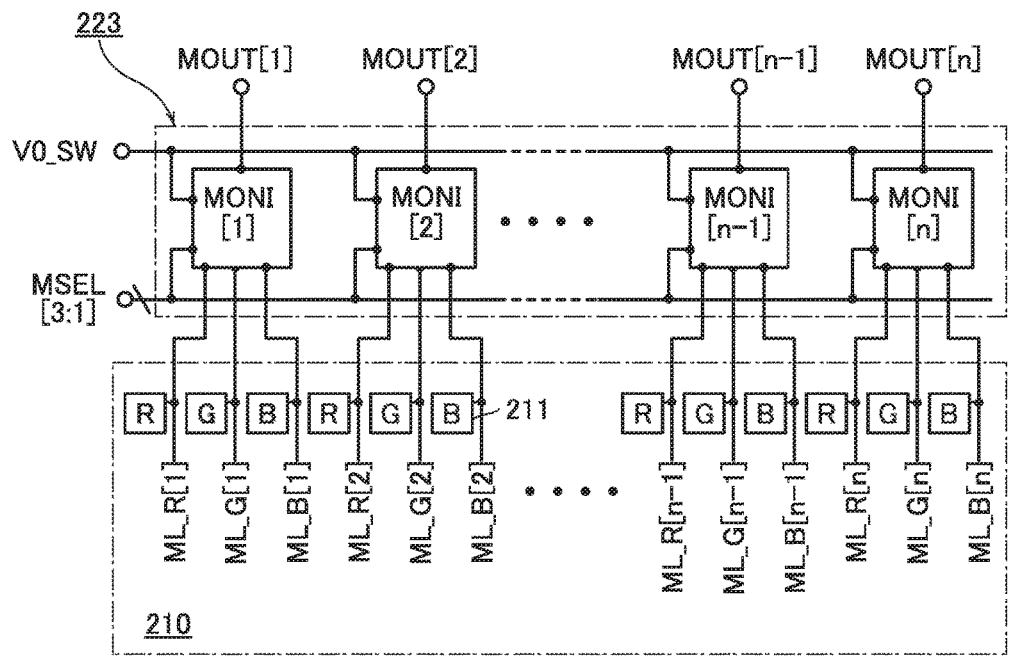
FIGS. 7A and 7B are circuit diagrams each illustrating a structure example of a monitor circuit.
Figure 7B:
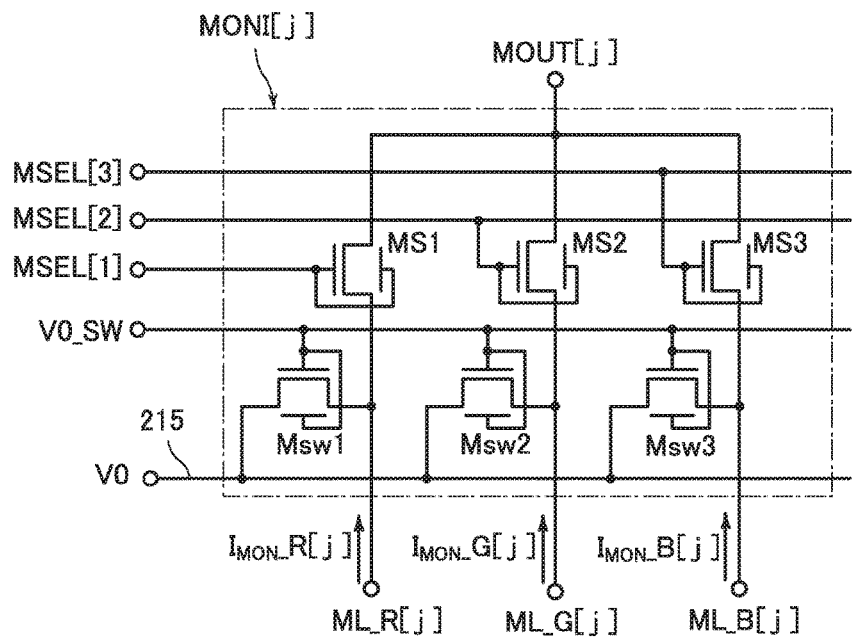

The current $I_{MON}$ is input to the monitor circuit 223. The monitor circuit 223 has a function of controlling the output of the current $I_{MON}$ to the ADC 224. FIG. 7A shows a structure example of the monitor circuit 223. The monitor circuit 223 is controlled by a signal V0_SW and signals MSEL[3] to MSEL[1] and includes n-stage circuits MONI. FIG. 7B is a circuit diagram showing a structure example of a circuit MONI[j]. For example, in the case where the resolution of the pixel portion 210 is 8K4K (4320×RGB (H)×7680 (V)), the monitor circuit 223 includes 4320 circuits MONI.

The circuit MONI is a three-input one-output circuit. To the input terminals of the circuit MONI, three wirings (ML_R, ML_G, and ML_B) are electrically connected, and the output terminal of the circuit MONI is a terminal MOUT, which is electrically connected to the ADC 224. The circuit MONI includes six transistors Msw1, Msw2, Msw3, MS1, MS2, and MS3. These transistors have a function as a switch. The transistor Msw1 controls electrical continuity between a power supply line 215 and the wiring ML_R, the transistor Msw2 controls electrical continuity between the power supply line 215 and the wiring ML_G, and the transistor Msw3 controls electrical continuity between the power supply line 215 and the wiring ML_B. The transistor MS1 controls electrical continuity between the terminal MOUT and the wiring ML_R, the transistor MS2 controls electrical continuity between the terminal MOUT and the wiring ML_G, and the transistor MS3 controls electrical continuity between the terminal MOUT and the wiring ML_B. The power supply line 215 is a wiring for supplying the voltage V0.

The signal V0_SW is input to the gates of the transistors Msw1 to Msw3. The signals MSEL[1], MSEL[2], and MSEL[3] are input to the gates of the transistors MS1, MS2, and MS3, respectively. During the writing period (the period P1 in FIG. 6B) and the light emission period (the period P2 in FIG. 6B), the transistors Msw1 to Msw3 are turned on and the transistors MS1 to MS3 are turned off. During the monitor period (the period P3 in FIG. 6B), the transistors Msw1 to Msw3 are turned off. Any one of the transistors MS1 to MS3 is controlled to be turned on. In the monitor period, current signals $I_{MON}$_R[j], $I_{MON}$_G[j], and $I_{MON}$_B[j] that flow through the wirings ML_R[j], ML_G[j], and ML_B[j], respectively, are sequentially output from the terminal MOUT[j].

Here, although the transistors Msw1 to Msw3 and the transistors MS1 to MS3 are n-channel transistors, some or all of the transistors may be p-channel transistors. Furthermore, although the transistors Msw1 to Msw3 and the transistors MS1 to MS3 each include a back gate, some or all of the transistors may be transistors which do not include back gates.

<ADC and Read Circuit>

Figure 8:
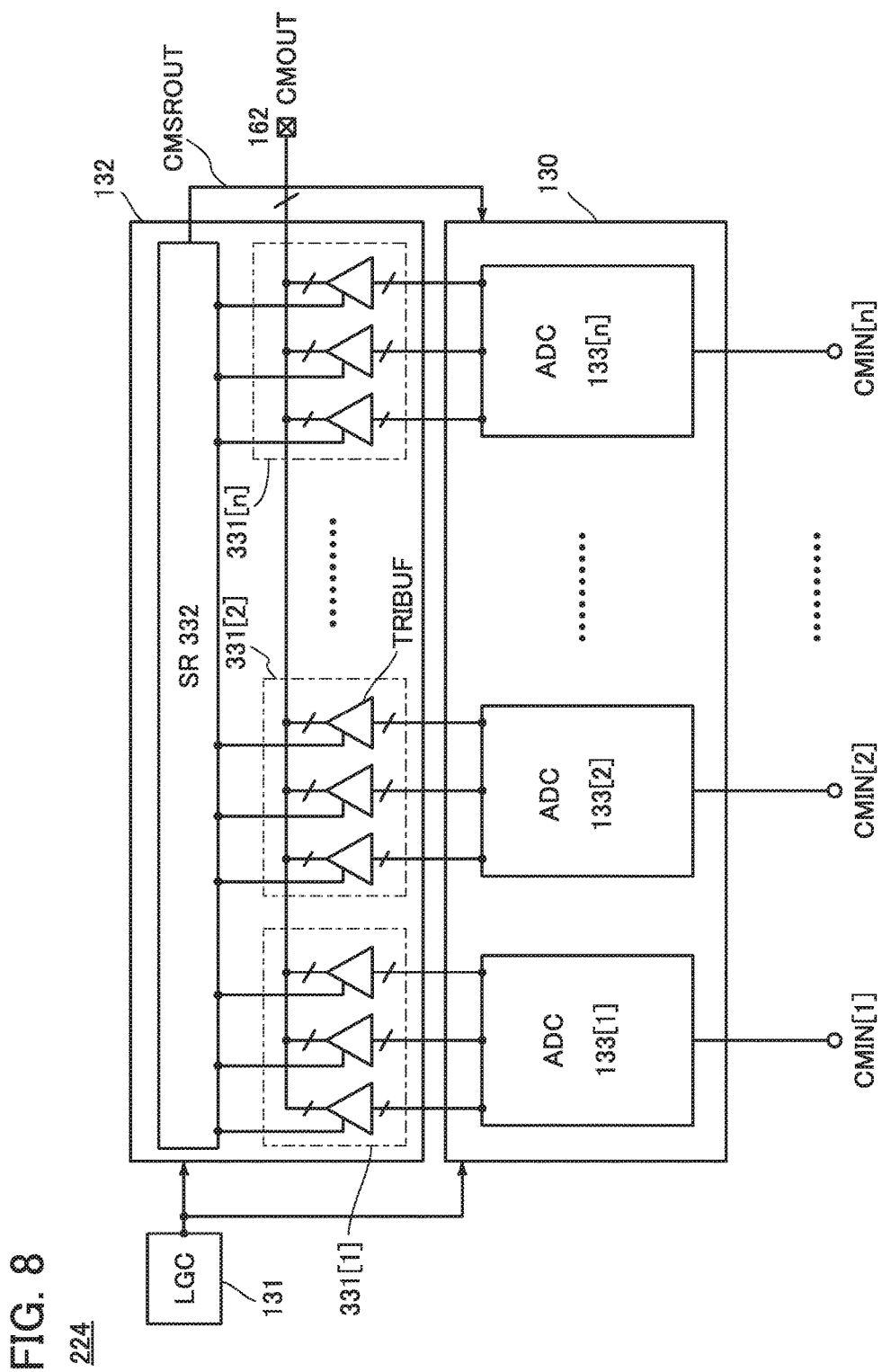
FIG. 8 is a circuit diagram illustrating a structure example of an ADC.

FIG. 8 illustrates a structure example of the ADC 224. The ADC 224 includes an ADC 130, a logic circuit (LGC) 131, and a read circuit 132.

The ADC 130 includes n ADCs 133. A terminal CMIN functions as an input terminal of the ADC. A signal output from the terminal MOUT[j] shown in FIG. 7B is input from the terminal CMIN[j] to the ADC133[j].

The ADC 133 has a function of detecting the values of current signals ($I_{MON}$_R, $I_{dMON}$_G, and $I_{MON}$_B) input from the terminal CMIN. In other words, the ADC 133 has a function of converting a current signal input from the terminal CMIN to a digital signal.

The circuit 132 includes a shift register (SR) 332 and n circuits 331. The circuit 331[j] has a function of controlling output of a signal from the ADC 133[j] to the terminal 162. The circuit 331 can include one or a plurality of three-state buffer circuits (TRIBUF), for example. The SR 332 has a function of generating a control signal of the circuit 331. Here, the SR 332 generates an enable signal of the TRIBUF. The SR 332 selects one of the plurality of TRIBUFs, and connects the selected TRIBUF and the terminal 162 to bring the output of the TRIBUF into a high impedance state.

The LGC 131 has a function of generating control signals for controlling the ADC 130 and the read circuit 132.

Furthermore, the SR 332 has a function of generating a signal for controlling the ADCs 133. For example, to the ADC 130, a signal CMSROUT from the last stage of the SR 332 is input.

The semiconductor device 10a described in Embodiment 1 is preferably used as the ADCs 133. By using the ADC 133 as the semiconductor device 10a, the ADCs can detect current signals ($I_{MON}$_R, $I_{MON}$_G, and $I_{MON}$_B) accurately. As a result, a display panel with high display quality and with reduced variation in the luminance of light-emitting elements can be provided.

Embodiment 3

In this embodiment, a current detection circuit that can be supplied to the display panel 200 described in the above embodiment is described with reference to FIG. 9 and FIG. 10.

<Semiconductor Device 10b>

Figure 9:
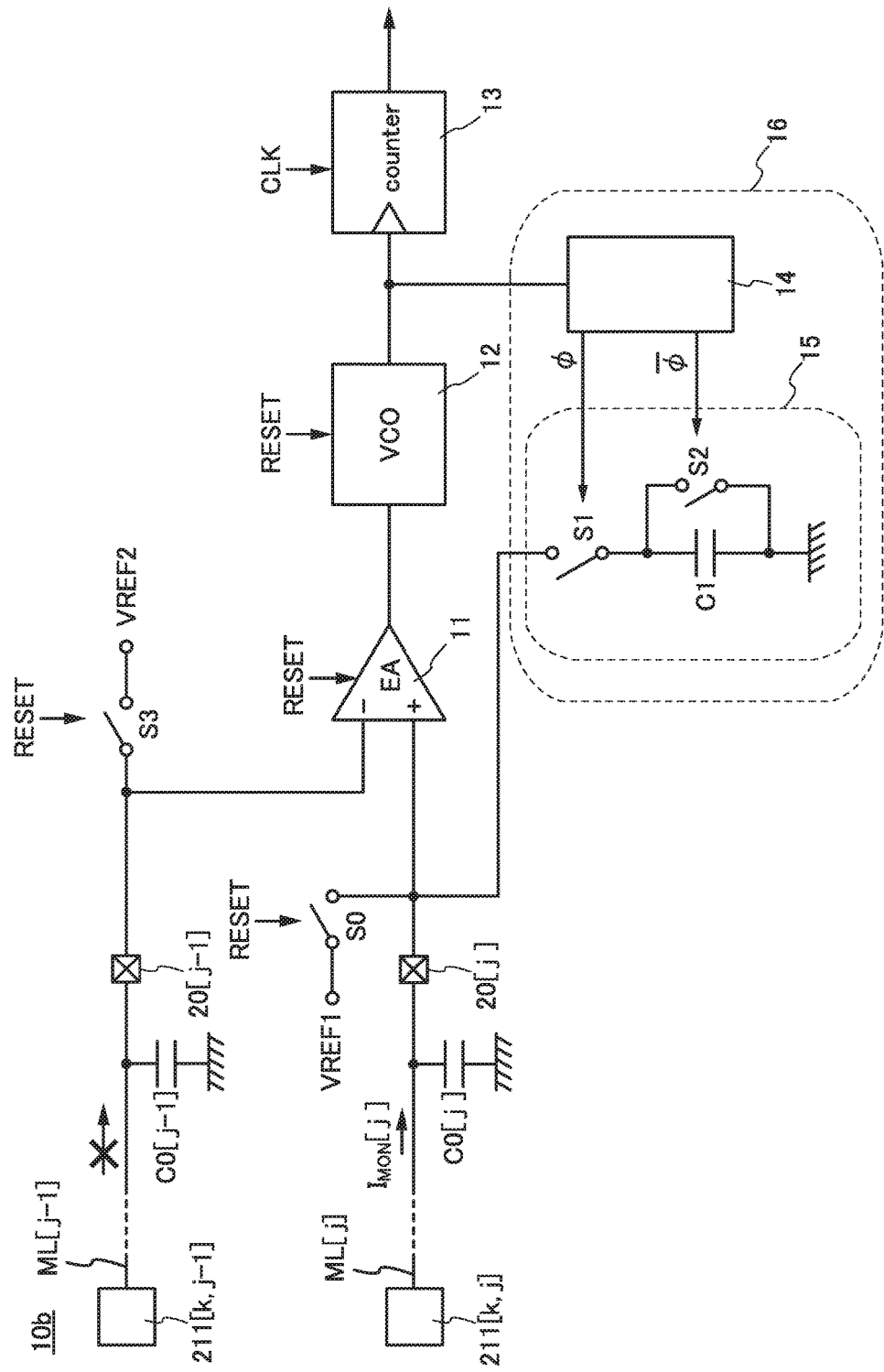
FIG. 9 is a circuit diagram illustrating a structure example of a semiconductor device.

A semiconductor device 10b illustrated in FIG. 9 has a function of monitoring current $I_{MON}$[j] flowing through the wiring ML[j] of the pixel 211[k, j] illustrated in FIG. 6A. In the semiconductor device 10b, the terminal (−) of the error amplifier 11 is electrically connected to the pixel 211[k, j−1] through the terminal 20[j−1] and the wiring ML[j−1]. The terminal (+) of the error amplifier 11 is electrically connected to the pixel 211[k, j] through the terminal 20[j] and the wiring ML[j]. The pixel 211[k, j−1] is adjacent to the pixel 211[k, j]. The terminal (−) of the error amplifier 11 is supplied with the voltage VREF2 through the switch S3. The switch S3 is turned on and off by the signal RESET. The description of the semiconductor device 10a in Embodiment 1 may be referred to for the details of the other components of the semiconductor device 10b.

In the case of monitoring the current $I_{MON}$[j], it is preferable that current does not flow through the wiring ML[j−1]. Specifically, an image signal is supplied to the pixel 211[k, j−1] so that current does not flow through the driving transistor of the pixel 211[k, j−1]. For example, when the image signal is a 12-bit signal, a data signal with a 0-level grayscale (a data signal for black display) is written into the pixel 211[k, j−1].

In the above state where current does not flow through the wiring ML[j−1], the switch S3 is turned on by the signal RESET, thereby supplying the voltage VREF2 to the terminal (−) of the error amplifier 11. Next, by turning off the switch S3 and making the wiring ML[j−1] into an electrical floating state, the state in which the voltage VREF2 is supplied to the terminal (−) can be maintained. A data signal with a 4095-level grayscale (a data signal for white display) is written into the pixel 211[k,j]. For the details about the subsequent operation of the semiconductor device 10b, refer to the timing chart of the semiconductor device 10a illustrated in FIG. 3.

In FIG. 9, the wirings ML[j−1] and ML[j] have a common noise source (e.g., parasitic capacitance of wirings). Thus, noise generated from the noise source (common noise) is canceled in the error amplifier 11, which is a differential amplifier circuit. In other words, the semiconductor device 10b has a function of canceling the common noise. As a result, the semiconductor device 10b can detect the current $I_{MON}$[j] accurately.

<Semiconductor Device 10c>

Figure 10:
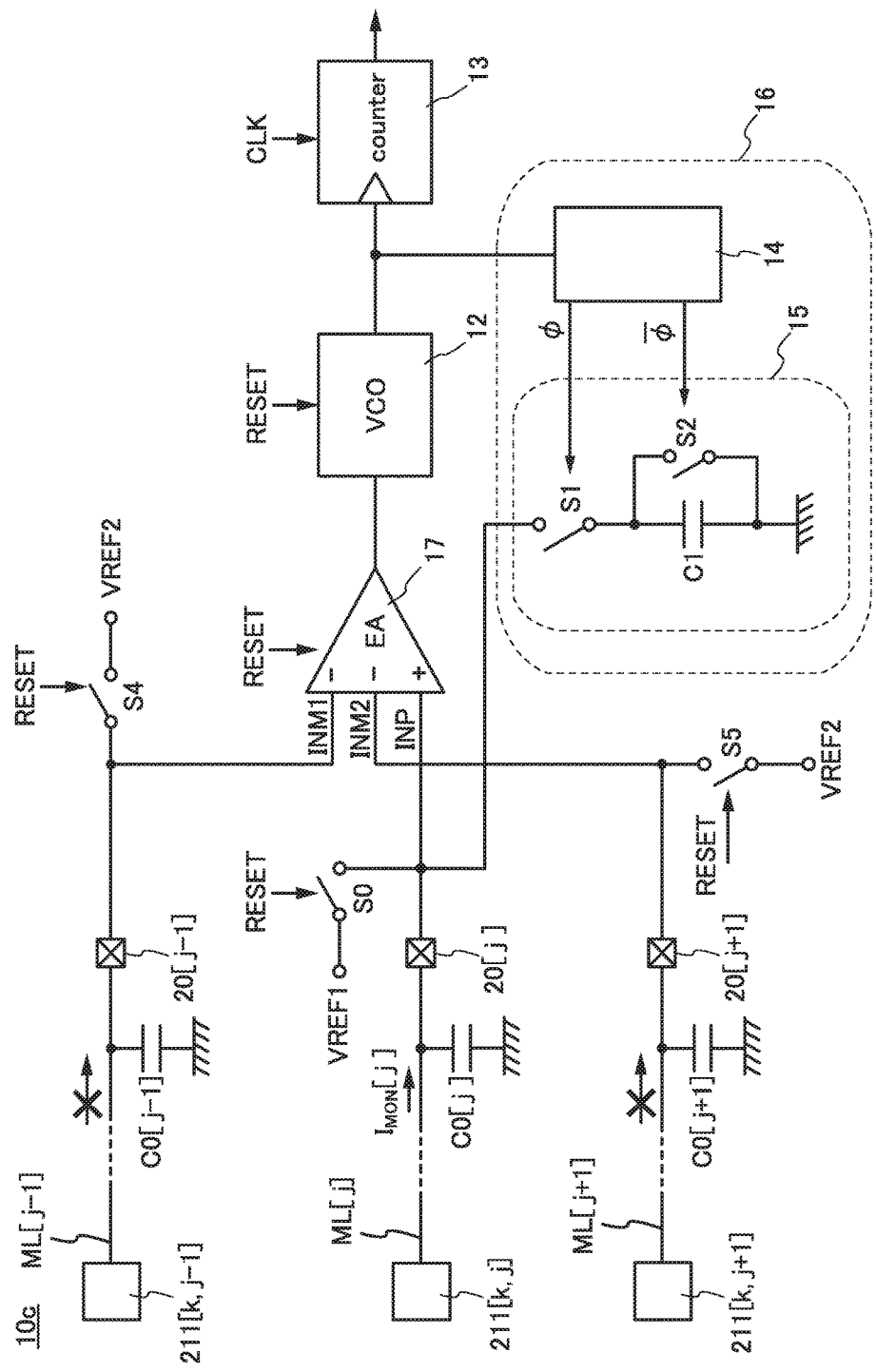
FIG. 10 is a circuit diagram illustrating a structure example of a semiconductor device.

A semiconductor device 10c illustrated in FIG. 10 has a function of monitoring the current $I_{MON}$[j] flowing through the wiring ML[j] of the pixel 211[k, j] illustrated in FIG. 6A. The semiconductor device 10c includes an error amplifier 17 that includes one terminal (+) and two terminals (−). Hereinafter, the terminal (+) of the error amplifier 17 is referred to as a terminal INP, one of the two terminals (−) is referred to as a terminal INM1, and the other of the two terminals (−) is referred to as a terminal INM2.

The error amplifier 17 has a function of integrating the difference between the average of the voltages of the terminal INM1 and the terminal INM2 and the voltage of the terminal INP and outputting the integrated difference. For example, when the voltages of the terminals INM1, INM2, and INP are $V_{inm1}$, $V_{inm2}$, and $V_{inp}$, respectively, the error amplifier 17 integrates the voltage difference between these terminals (($V_{inm1}$+Vinm$_2$)/2-$V_{inp}$) and outputs the integrated difference.

In the semiconductor device 10c illustrated in FIG. 10, the terminal INP is electrically connected to the pixel 211[k, j] through the terminal 20[j] and the wiring ML[j]. The terminal INM1 is electrically connected to the pixel 211[k, j−1] through the terminal 20[j−1] and the wiring ML[j−1]. The terminal INM2 is electrically connected to the pixel 211[k, j+1] through the terminal 20[j+1] and the wiring ML[j+1]. The pixel 211[k, j] is adjacent to the pixel 211[k, j+1] and the pixel 211[k, j+1], and the pixel 211[k, j−1] and the pixel 211[k, j+1] are arranged with the pixel 211[k, j] interposed therebetween. The terminal INM1 is supplied with the voltage VREF2 through a switch S4, and the terminal INM2 is supplied with the voltage VREF2 through a switch S5. The switch S4 and the switch S5 are turned on and off by the signal RESET. The description of the semiconductor device 10a in Embodiment 1 may be referred to for the details of the other components of the semiconductor device 10c.

As in the case of the semiconductor device 10b, in the case of monitoring the current $I_{MON}$[j] in the semiconductor device 10c, it is preferable that current does not flow through the wirings ML[j−1] and ML[j+1]. Specifically, image signals are supplied to the pixel 211[k, j−1] and the pixel 211[k, j+1] so that current does not flow through the driving transistors of the pixel 211[k, j−1] and the pixel 211[k, j+1]. For example, when the image signal is a 12-bit signal, data signals with a 0-level grayscale (data signals for black display) are written into the pixel 211[k, j−1] and the pixel 211[k, j+1].

In the above state where current does not flow through the wiring ML[j−1] and the wiring ML[j+1], the switch S4 and switch S5 are turned on by the signal RESET, thereby supplying the voltage VREF2 to the terminal INM1 and the terminal INM2 of the error amplifier 17. Next, by turning off the switch S4 and making the wiring ML[j−1] into an electrically floating state, the state in which the voltage VREF2 is supplied to the terminal INM1 can be maintained. Furthermore, by turning off the switch S5 and making the wiring ML[j+1] into an electrically floating state, the state in which the voltage VREF2 is supplied to the terminal INM2 can be maintained. A data signal with a 4095-level grayscale (a data signal for white display) is written into the pixel 211[k,j]. For details about the subsequent operation of semiconductor device 10c, refer to the timing chart of the semiconductor device 10a illustrated in FIG. 3.

In FIG. 10, the wirings ML[j−1] to ML[j+1] have a common noise source. Thus, noise generated from the noise source is canceled in the error amplifier 17, which is a differential amplifier circuit. In other words, the semiconductor device 10c has a function of canceling common noise. As a result, the semiconductor device 10c can detect the current $I_{MON}$[j] accurately.

From the above, by using the semiconductor device 10b or the semiconductor device 10c for the display panel 200, the current of a driving transistor can be detected accurately. Therefore, the display panel 200 can compensate variation in the luminance of light-emitting elements, and thus a display panel with high display quality can be provided.

Embodiment 4

In this embodiment, more specific structure examples of the display panel described in any of the above embodiments are described with reference to FIGS. 11A to 11D, FIGS. 12A and 12B, FIG. 13, FIG. 14, and FIG. 15.

<Top View Illustrating Structure Example of Display Panel>

FIGS. 11A to 11D and FIGS. 12A and 12B are top views each illustrating a structure example of the display panel.

Figure 11A:
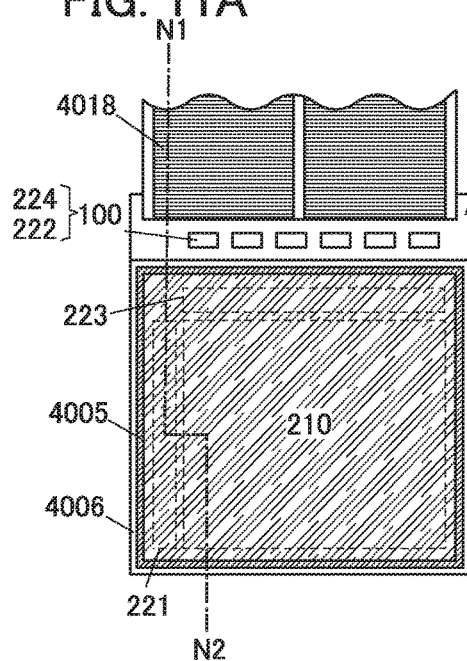
FIGS. 11A to 11D are top views each illustrating a structure example of a display panel.

In FIG. 11A, a sealant 4005 is provided to surround the pixel portion 210, the gate driver circuit 221, and the monitor circuit 223 provided over a first substrate 4001, and the circuits are sealed between the first substrate 4001 and a second substrate 4006. In FIG. 11A, the source driver circuit 222 and the ADC 224 are provided in a region different from a region surrounded by the sealant 4005 over the first substrate 4001. The source driver circuit 222 and the ADC 224 may be formed using ICs. FIG. 11A illustrates an example in which the source driver circuit 222 and the ADC 224 are formed using six ICs 100. Note that the number of ICs 100 is not limited thereto, and the required number of ICs 100 may be provided depending on the number of pixels.

In FIG. 11A, the six ICs 100 each include the source driver circuit 222 and the ADC 224. For example, in the case where the resolution of the display panel is 4K2K (3840×2160), the number (n) of terminals CMIN in FIG. 8 is 640 (=3840/6) in one IC. For example, in the case where the resolution of the display panel is 8K4K (7680×4320), the number (n) of terminals CMIN in FIG. 8 is 1280 (=7680/6) in one IC.

A signal and a potential are supplied to each circuit over the first substrate 4001 from a flexible printed circuit (FPC) 4018.

Figure 11B:
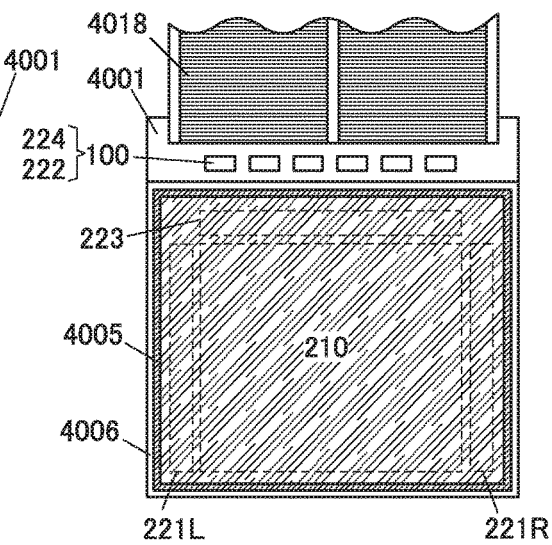

In FIG. 11A, the gate driver circuits 221 may be provided in the pixel portion 210 from side to side. FIG. 11B is a top view of such a case. In FIG. 11B, the sealant 4005 is provided to surround the pixel portion 210, a gate driver circuit 221L, a gate driver circuit 221R, and the monitor circuit 223, and the circuits are sealed between the first substrate 4001 and the second substrate 4006.

FIGS. 11A and 11B each illustrate an example in which the ICs 100 are provided by chip on glass (COG).

Figure 11C:
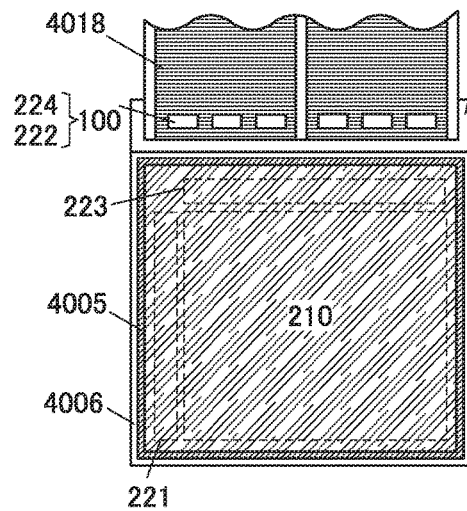
Figure 11D:
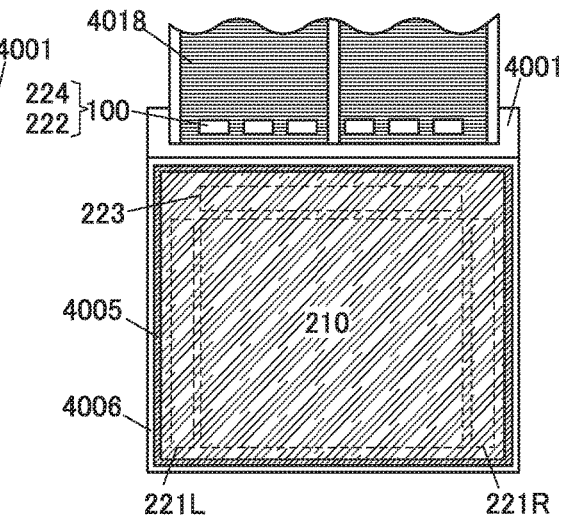

Note that there is no particular limitation on a method for connecting the ICs 100. Wire bonding, tape carrier package (TCP), chip on film (COF), or the like as well as COG can be used. FIG. 11C illustrates an example in which the ICs 100 in FIG. 11A are provided by TCP. Similarly, FIG. 11D illustrates an example in which the ICs 100 in FIG. 11B are provided by TCP.

Figure 12A:
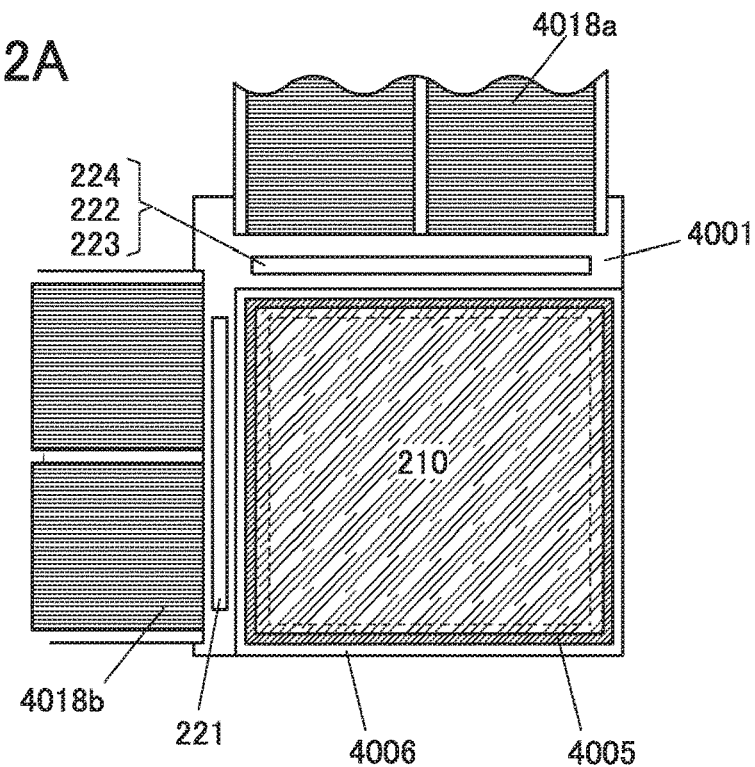
FIGS. 12A and 12B are top views each illustrating a structure example of a display panel.

In FIG. 12A, the sealant 4005 is provided to surround the pixel portion 210 provided over the first substrate 4001, and the pixel portion 210 is sealed between the first substrate 4001 and the second substrate 4006. In FIG. 12A, the peripheral circuit 220 (including the gate driver circuit 221, the monitor circuit 223, the source driver circuit 222, and the ADC 224) are provided in a region different from a region surrounded by the sealant 4005 over the first substrate 4001. The peripheral circuit 220 may be formed by a manufacturing method different from that of the pixel portion 210, for example, by using ICs. In the case where the peripheral circuit 220 is formed using ICs, the number of ICs is not limited to one and may be more than one. Note that there is no particular limitation on a method for connecting the ICs. COG, wire bonding, TCP, COF, or the like can be used.

Figure 12B:
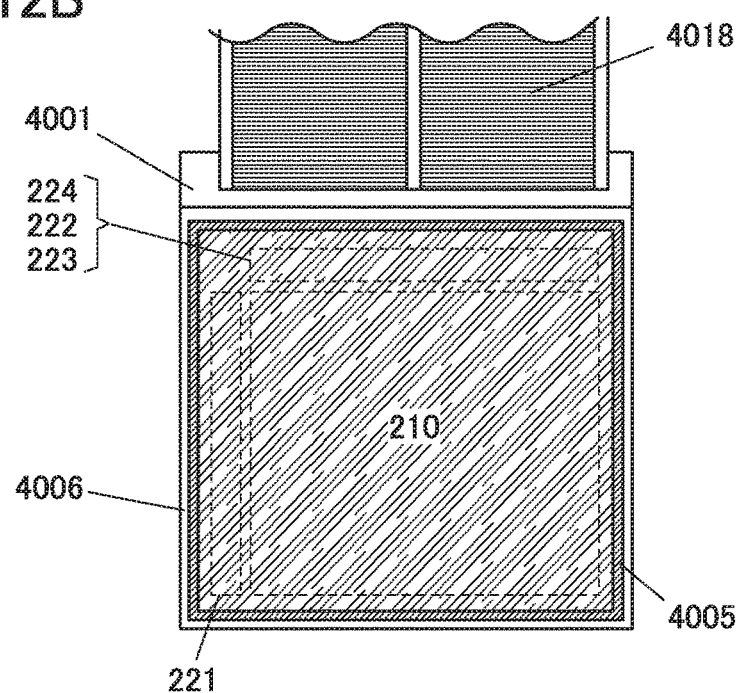

In FIG. 12B, the sealant 4005 is provided to surround the pixel portion 210 and the peripheral circuit 220 (including the gate driver circuit 221, the monitor circuit 223, the source driver circuit 222, and the ADC 224) provided over the first substrate 4001, and the pixel portion 210 and the peripheral circuit 220 are sealed between the first substrate 4001 and the second substrate 4006. The peripheral circuit 220 may be formed in the same manufacturing process as the pixel portion 210 or may be formed in a manufacturing process different from that of the pixel portion 210. For example, each of the pixel portion 210 and the peripheral circuit 220 may be formed using a polycrystalline silicon transistor. For example, each of the pixel portion 210 and the peripheral circuit 220 may be formed using a single crystal silicon transistor. For example, the pixel portion 210 may be formed using an oxide semiconductor transistor, and the peripheral circuit 220 may be formed using a polycrystalline silicon transistor.

<Cross-Sectional View Illustrating Structure Example of Display Panel>

Figure 13:
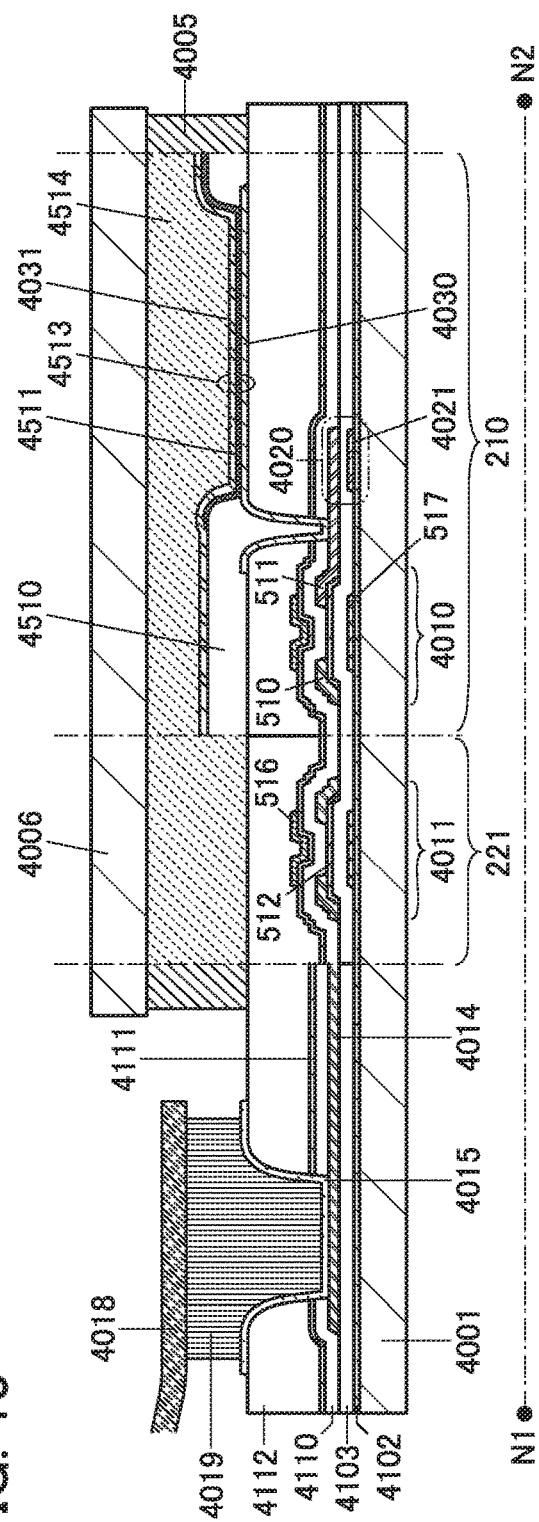
FIG. 13 is a cross-sectional view illustrating a structure example of a display panel.

FIG. 13 is a cross-sectional view illustrating a cross-sectional structure of a portion taken along a dashed-dotted line N1-N2 in FIG. 11A.

The display panel FIG. 13 includes an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4110, 4111, and 4112. The electrode 4015 is formed using the same conductive layer as a first electrode layer 4030.

The pixel portion 210 and the gate driver circuit 221 provided over the first substrate 4001 include a plurality of transistors. In FIG. 13, a transistor 4010 included in the pixel portion 210 and a transistor 4011 included in the gate driver circuit 221 are illustrated as an example. A partition 4510 is provided over the insulating layer 4112 in FIG. 13.

The transistors 4010 and 4011 are provided over an insulating layer 4102. The transistors 4010 and 4011 include electrodes 517 over the insulating layer 4102. An insulating layer 4103 is formed over the electrodes 517. Semiconductor layers 512 are formed over the insulating layer 4103. Electrodes 510 and electrodes 511 are formed over the semiconductor layers 512. The insulating layer 4110 and the insulating layer 4111 are formed over the electrodes 510 and the electrodes 511. Electrodes 516 are formed over the insulating layer 4110 and the insulating layer 4111. The electrodes 510 and the electrodes 511 are formed using the same conductive layer as the wiring 4014.

In each of the transistors 4010 and 4011, the electrode 517 functions as a gate electrode; the electrode 510 functions as one of a source electrode and a drain electrode; the electrode 511 functions as the other of the source electrode and the drain electrode; and the electrode 516 functions as a back gate electrode.

Since the transistors 4010 and 4011 each include a bottom gate and a back gate, the on-state current of the transistors can be increased. Moreover, the threshold voltage of the transistors can be controlled.

In each of the transistors 4010 and 4011, the semiconductor layer 512 functions as a channel formation region. For the semiconductor layer 512, crystalline silicon, polycrystalline silicon, amorphous silicon, an oxide semiconductor, an organic semiconductor, or the like may be used. Impurities may be introduced to the semiconductor layer 512, as necessary, to increase the conductivity of the semiconductor layer 512 or control the threshold voltage of the transistor.

In the case where an oxide semiconductor is used for the semiconductor layer 512, the semiconductor layer 512 preferably includes indium (In). When an oxide semiconductor containing indium is used for the semiconductor layer 512, the carrier mobility (electron mobility) of the semiconductor layer 512 can be high. The semiconductor layer 512 is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The semiconductor layer 512 is preferably an oxide semiconductor containing zinc (Zn). When the oxide semiconductor contains zinc, the oxide semiconductor is easily crystallized in some cases.

The semiconductor layer 512 is not limited to the oxide semiconductor containing indium. The oxide semiconductor layer 512 may be, for example, an oxide semiconductor that does not contain indium and contains zinc, an oxide semiconductor that does not contain indium and contains gallium, or an oxide semiconductor that does not contain indium and contains tin, e.g., a zinc tin oxide or a gallium tin oxide.

The display panel illustrated in FIG. 13 includes a capacitor 4020. The capacitor 4020 has a region in which the electrode 511 overlaps with an electrode 4021 with the insulating layer 4103 therebetween. The electrode 4021 is formed using the same conductive layer as the electrodes 517.

FIG. 13 illustrates an example of a display panel including, as a display element, a light-emitting element such as an EL element. EL elements are classified into organic EL elements and inorganic EL elements.

In the organic EL element, by supply of voltage, electrons are injected from one electrode to an EL layer and holes are injected from the other electrode to the EL layer. The carriers (electrons and holes) are recombined, and thus, a light-emitting organic compound is excited. When the light-emitting organic compound returns to a ground state from the excited state, light is emitted. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like. The EL layer can be formed by vapor deposition (including vacuum vapor deposition), a transfer method, a printing method, an inkjet method, a coating method, or the like.

The inorganic EL elements are classified into a dispersion-type inorganic EL element and a thin-film inorganic EL element depending on the element structure. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

An example in which an organic EL element is used as a light-emitting element 4513 is described below.

The light-emitting element 4513 is electrically connected to the transistor 4010 provided in the pixel portion 210. The structure of the light-emitting element 4513 is a layered structure including the first electrode layer 4030, a light-emitting layer 4511, and a second electrode layer 4031; however, this embodiment is not limited to this structure. The structure of the light-emitting element 4513 can be changed as appropriate depending on a direction in which light is extracted from the light-emitting element 4513, or the like.

The partition 4510 is formed using an organic insulating material or an inorganic insulating material. It is particularly preferable that the partition 4510 be formed using a photosensitive resin material to have an opening over the first electrode layer 4030 so that a side surface of the opening slopes with continuous curvature.

The light-emitting layer 4511 may be formed using a single layer or a stack of a plurality of layers.

A protective layer may be formed over the second electrode layer 4031 and the partition 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond-like carbon (DLC), or the like can be used. In addition, in a space that is enclosed by the first substrate 4001, the second substrate 4006, and the sealant 4005, a filler 4514 is provided for sealing. It is preferable that, in this manner, the light-emitting element be packaged (sealed) with a protective film (e.g., a laminate film or an ultraviolet curable resin film) or a cover member with high air-tightness and little degasification so that the light-emitting element is not exposed to the outside air.

As the filler 4514, an ultraviolet curable resin or a thermosetting resin as well as an inert gas such as nitrogen or argon can be used. For example, polyvinyl chloride (PVC), an acrylic resin, polyimide, an epoxy resin, a silicone resin, polyvinyl butyral (PVB), or ethylene vinyl acetate (EVA) can be used. A desiccant agent may be contained in the filler 4514.

A glass material such as a glass frit, or a resin material such as a two-component-mixture-type resin that is curable at room temperature, a light curable resin, or a thermosetting resin can be used for the sealant 4005. A desiccant agent may be contained in the sealant 4005.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface to reduce glare can be performed.

When the light-emitting element has a microcavity structure, light with high color purity can be extracted. Furthermore, when a microcavity structure and a color filter are used in combination, glare can be reduced and the visibility of a display image can be increased.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof and nitrides thereof.

Alternatively, a conductive composition containing a conductive high molecule (also called a conductive polymer) can be used for the first electrode layer 4030 and the second electrode layer 4031. As the conductive high molecule, a so-called π-electron conjugated conductive high molecule can be used. Examples include polyaniline or a derivative thereof, polypyrrole or a derivative thereof, polythiophene or a derivative thereof, and a copolymer of two or more of aniline, pyrrole, and thiophene or a derivative thereof.

In order to extract light emitted from the light-emitting element 4513 to the outside, at least one of the first electrode layer 4030 and the second electrode layer 4031 is transparent. In accordance with how to extract light, the structures of the display panels are classified into a top emission structure, a bottom emission structure, and a dual emission structure. In the top emission structure, light is extracted through a surface (top surface) opposite to a substrate where a transistor and a light-emitting element are formed. In the bottom emission structure, light is extracted through a surface (bottom surface) of a substrate where a transistor and a light-emitting element are formed. In the dual emission structure, light is extracted through a top surface and a bottom surface. For example, the second electrode layer 4031 is transparent in the case of the top emission structure. For example, the first electrode layer 4030 is transparent in the case of the bottom emission structure. For example, the first electrode layer 4030 and the second electrode layer 4031 are transparent in the case of the dual emission structure.

Figure 14:
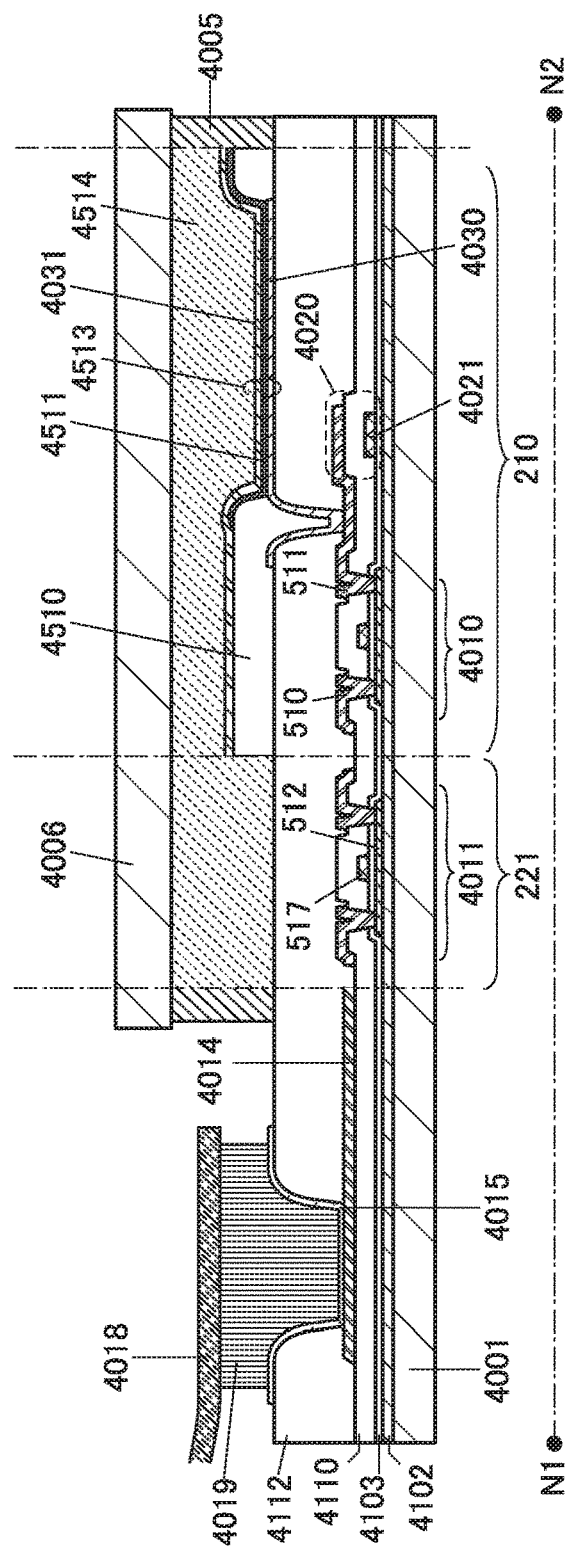
FIG. 14 is a cross-sectional view illustrating a structure example of a display panel.

FIG. 14 is a cross-sectional view in which top-gate transistors are provided as the transistors 4010 and 4011 in FIG. 13.

In each of the transistors 4010 and 4011 in FIG. 14, the electrode 517 functions as a gate electrode, the electrode 510 functions as one of a source electrode and a drain electrode, and the electrode 511 functions as the other of the source electrode and the drain electrode.

The description of FIG. 13 can be referred to for the details of other components in FIG. 14.

Figure 15:
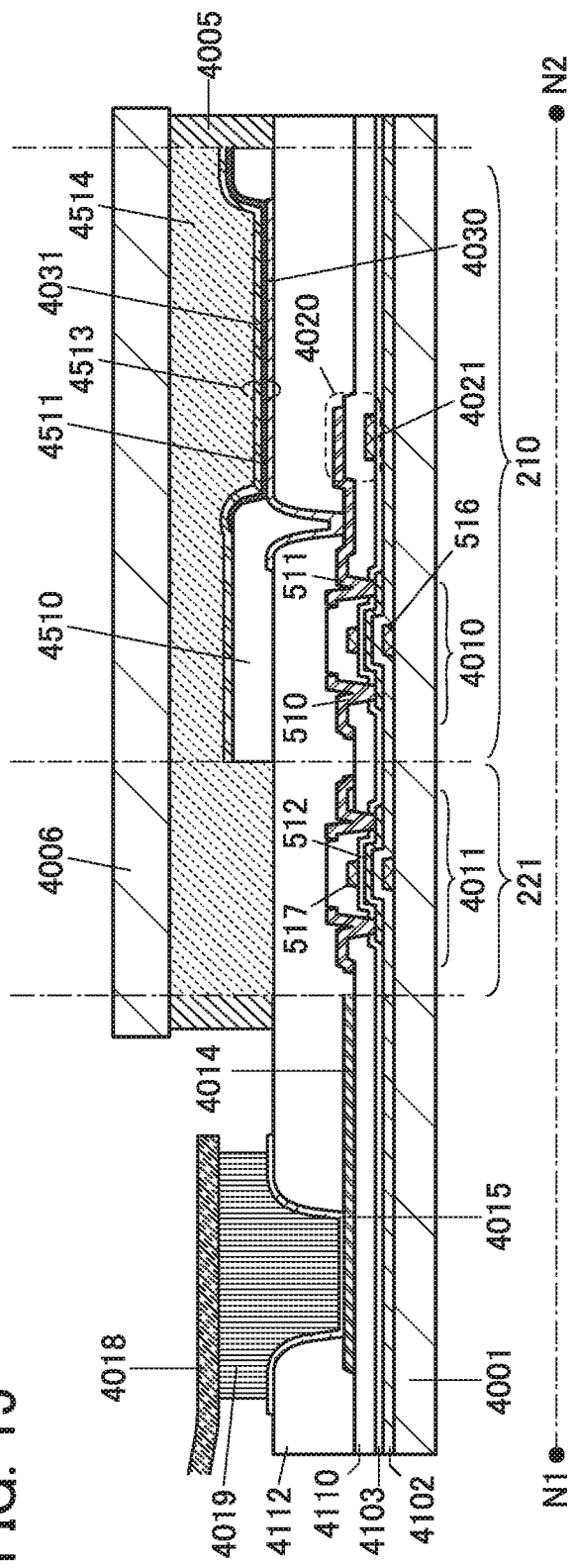
FIG. 15 is a cross-sectional view illustrating a structure example of a display panel.

FIG. 15 is a cross-sectional view in which the transistors 4010 and 4011 in FIG. 14 each include an electrode 516 functioning as a back gate.

The transistors 4010 and 4011 each include a top gate and a back gate, so that the on-state current of the transistors can be increased. In addition, the threshold voltage of the transistors can be controlled.

The description of FIG. 13 can be referred to for the details of other components in FIG. 15.

Embodiment 5

An application example of a display module including the display panel described in any of the above embodiments is described with reference to FIG. 16.

Figure 16:
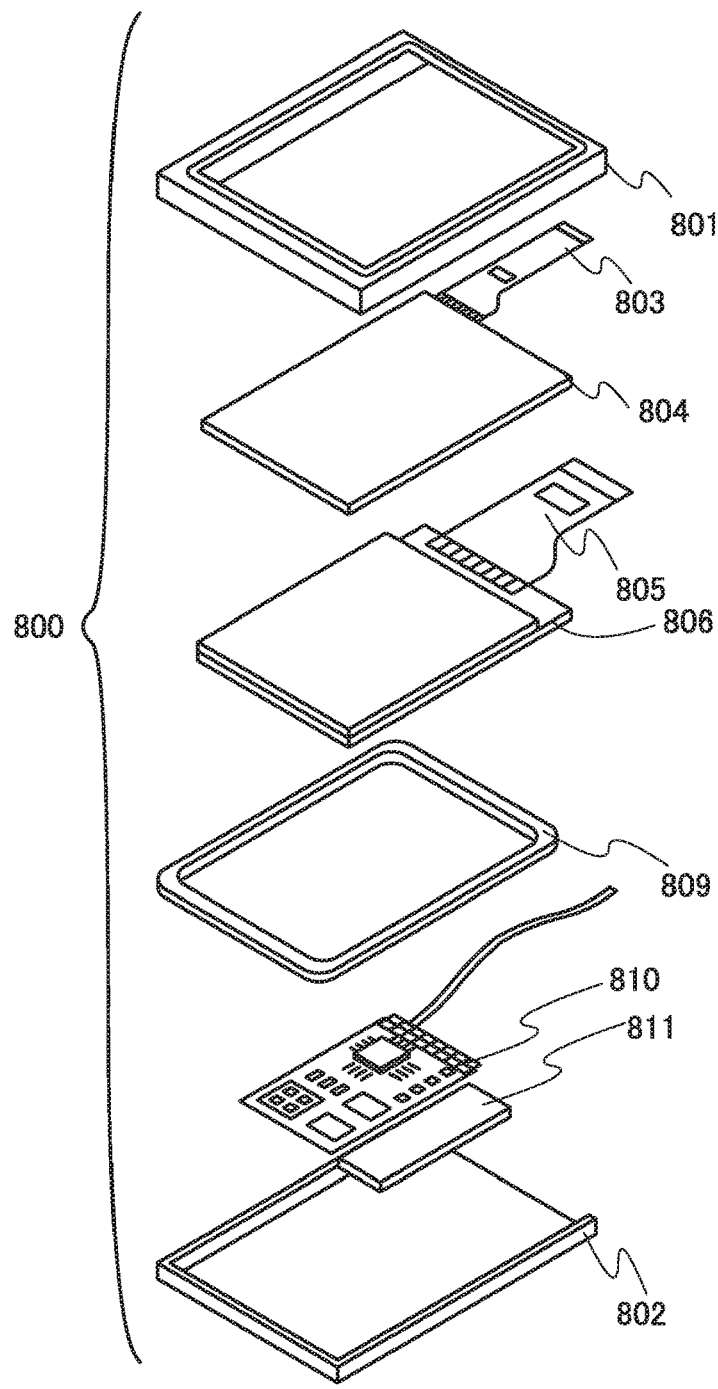
FIG. 16 illustrates an example of a display module.

In a display module 800 in FIG. 16, a touch panel 804 connected to an FPC 803, a display panel 806 connected to an FPC 805, a frame 809, a printed circuit board 810, and a battery 811 are provided between an upper cover 801 and a lower cover 802. Note that the battery 811, the touch panel 804, and the like are not provided in some cases.

The display panel described in any of the above embodiments can be used as the display panel 806 in FIG. 16.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can overlap with the display panel 806. It is also possible to provide a touch panel function for a counter substrate (sealing substrate) of the display panel 806. Alternatively, an optical sensor may be provided in each pixel of the display panel 806 so that an optical touch panel can be obtained. Alternatively, an electrode for a touch sensor may be provided in each pixel of the display panel 806 so that a capacitive touch panel can be obtained. In such a case, the touch panel 804 can be omitted.

FIG. 17A is a schematic diagram illustrating a structure example where the touch panel 804 is a mutual capacitive touch sensor. In FIG. 17A, as an example, six wirings X1 to X6 represent wirings CLx to which pulse voltage is supplied, and six wirings Y1 to Y6 represent wirings CLy that detect changes in current. The number of wirings is not limited to those illustrated in FIG. 17A. FIG. 17A also illustrates a capacitor 824 that is formed with the wiring CLx and the wiring CLy overlapping with each other or being provided close to each other.

The wirings CLx are electrically connected to a driver circuit 821, and the wirings CLy are electrically connected to a detection circuit 822. The driver circuit 821 and the detection circuit 822 are formed in an IC chip 820.

The driver circuit 821 is, for example, a circuit for sequentially supplying pulse voltage to the wirings X1 to X6. By supplying pulse voltage to the wirings X1 to X6, an electric field is generated between the wirings CLx and CLy of the capacitors 824. With pulse voltage, current flows through the capacitor 824. An electric field generated between the wirings is changed by being blocked, for example, when a finger, a stylus, or the like touches the touch sensor. That is, for example, by touch with a finger, a stylus, or the like, the capacitance of the capacitor 824 is changed. By utilizing the change in capacitance caused by touch with a finger, a stylus, or the like as described above, the approach or contact of an object can be detected.

The detection circuit 822 is a circuit for detecting changes in current flowing through the wirings Y1 to Y6 that are caused by the changes in capacitance of the capacitors 824. No change in the current values of the wirings Y1 to Y6 is detected when there is no approach or contact of an object, whereas a decrease in the current value is detected when capacitance is decreased owing to the approach or contact of an object. In order to detect changes in current, the total amount of current may be detected. In that case, an integrator circuit or the like may be used to detect the total amount of current. Alternatively, the peak value of current may be detected. In that case, current may be converted into voltage, and the peak value of voltage may be detected.

Although the driver circuit 821 and the detection circuit 822 are formed in one IC chip in FIG. 17A, the driver circuit 821 and the detection circuit 822 may be formed in different IC chips. The detection circuit 822 easily malfunctions due to the influence of noise, while the driver circuit 821 might be a generation source of noise. The detection circuit 822 can be prevented from malfunctioning by being formed in an IC chip different from an IC chip in which the driver circuit 821 is formed.

The driver circuit 821, the detection circuit 822, and a driver circuit of the display panel 806 may be formed in one IC chip, which results in a reduction in proportion of the cost of an IC chip in the cost of the whole display module.

The IC chip 820 is provided in the touch panel 804 in FIG. 17A; however, the IC chip 820 may be provided in the FPC 803. FIG. 17B is a schematic view illustrating the case.

FIG. 16 is described again.

The frame 809 protects the display panel 806 and functions as an electromagnetic shield for blocking electromagnetic waves generated by the operation of the printed circuit board 810. The frame 809 may also function as a radiator plate.

The printed circuit board 810 includes a power supply circuit and a signal processing circuit for outputting a video signal and a clock signal. As a power source for supplying power to the power supply circuit, an external commercial power source or a separate power source using the battery 811 may be used. The battery 811 can be omitted in the case of using a commercial power source.

The display module 800 may be additionally provided with a member such as a polarizing plate, a retardation plate, or a prism sheet.

Embodiment 6

In this embodiment, examples of electronic devices including the display panel described in any of the above embodiments are described with reference to FIGS. 18A to 18F.

Examples of electronic devices that include the above display panel in a display portion are television devices (also referred to as TV or television receivers), monitors for computers and the like, cameras such as digital cameras and digital video cameras, digital photo frames, cellular phones (also referred to as cell phones or cellular phone devices), portable game machines, portable information terminals, audio reproducing devices, large game machines such as pinball machines, and the like. When having flexibility, the above electronic device can be incorporated along a curved inside/outside wall surface of a house or a building or a curved interior/exterior surface of a motor vehicle. FIGS. 18A to 18F illustrate structure examples of the electronic devices.

Figure 18A:
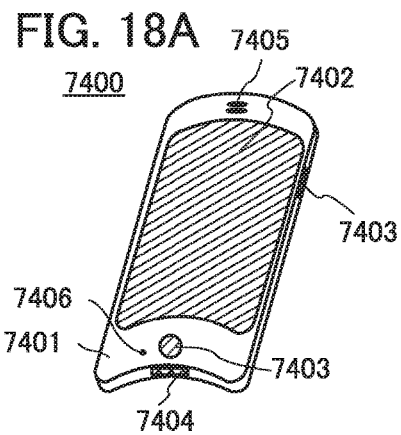
FIGS. 18A to 18F illustrate examples of an electronic device.

A cellular phone 7400 in FIG. 18A includes a display portion 7402 incorporated in a housing 7401, operation buttons 7403, an external connection port 7404, a speaker 7405, a microphone 7406, and the like. When the display portion 7402 of the cellular phone 7400 is touched with a finger or the like, data can be input to the cellular phone 7400. Furthermore, operations such as making a call and inputting a character can be performed by touch on the display portion 7402 with a finger or the like. The power can be turned on or off with the operation button 7403. In addition, types of images displayed on the display portion 7402 can be switched; for example, images can be switched from a mail creation screen to a main menu screen with the operation button 7403.

Figure 18B:
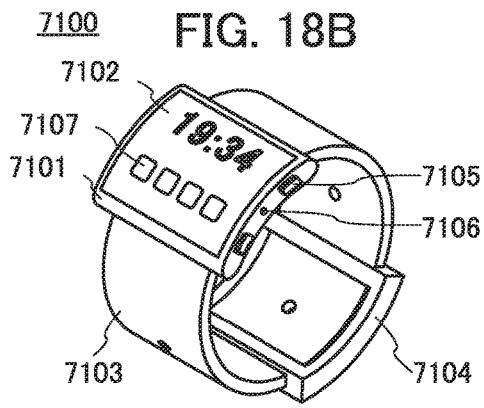

FIG. 18B illustrates an example of a watch-type portable information terminal. A portable information terminal 7100 in FIG. 18B includes a housing 7101, a display portion 7102, a band 7103, a buckle 7104, operation buttons 7105, an input/output terminal 7106, and the like. The portable information terminal 7100 is capable of executing a variety of applications such as mobile phone calls, e-mailing, text viewing and editing, music reproduction, Internet communication, and computer games. The display surface of the display portion 7102 is bent, and images can be displayed on the bent display surface. Furthermore, the display portion 7102 includes a touch sensor, and operation can be performed by touching a screen with a finger, a stylus, or the like. For example, an application can be started by touching an icon 7107 displayed on the display portion 7102.

With the operation button 7105, a variety of functions such as time setting, ON/OFF of the power, ON/OFF of wireless communication, setting and cancellation of a silent mode, and setting and cancellation of a power saving mode can be performed. For example, the functions of the operation button 7105 can be set freely by setting the operating system incorporated in the portable information terminal 7100. The portable information terminal 7100 can employ near field communication that is a communication method based on an existing communication standard. In that case, for example, intercommunication between the portable information terminal 7100 and a headset capable of wireless communication enables hands-free calling. Moreover, the portable information terminal 7100 includes the input/output terminal 7106, and data can be directly transmitted to and received from another information terminal through a connector. Charging through the input/output terminal 7106 is possible. Note that charging operation may be performed by wireless power feeding without using the input/output terminal 7106.

Figure 18C:
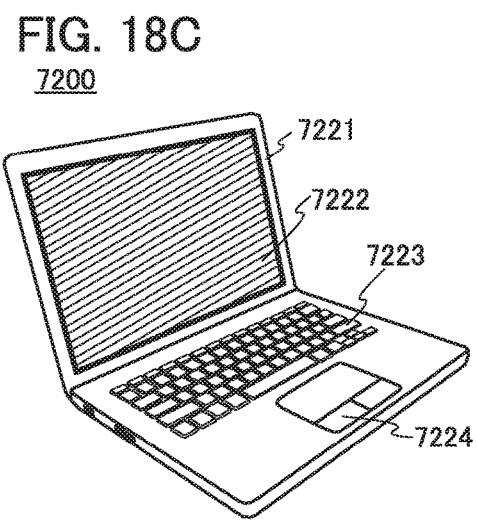

FIG. 18C illustrates a notebook personal computer (PC). A PC 7200 in FIG. 18C includes a housing 7221, a display portion 7222, a keyboard 7223, a pointing device 7224, and the like.

Figure 18D:
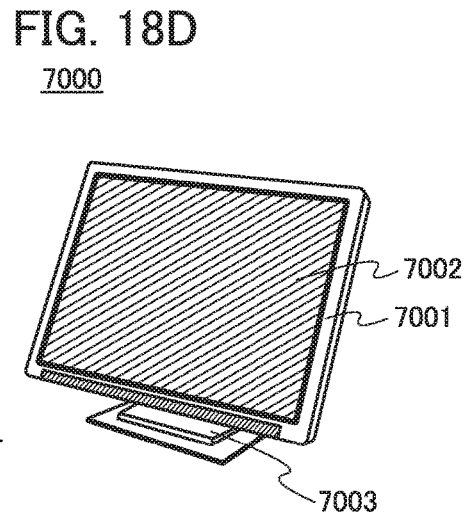

FIG. 18D illustrates a stationary display device. A display device 7000 in FIG. 18D includes a housing 7001, a display portion 7002, a support base 7003, and the like.

Figure 18E:
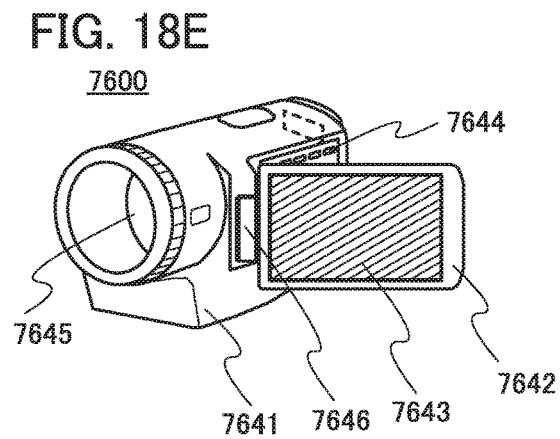

FIG. 18E illustrates a video camera 7600, which includes a first housing 7641, a second housing 7642, a display portion 7643, operation keys 7644, a lens 7645, a joint 7646, and the like.

Figure 18F:
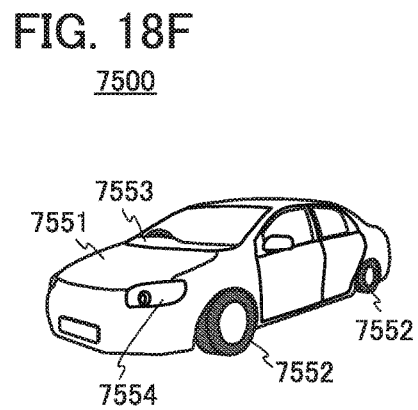

FIG. 18F illustrates a motor vehicle 7500, which includes a car body 7551, wheels 7552, a dashboard 7553, lights 7554, and the like.

The electronic devices each including the semiconductor device described in Embodiment 1 can each include a display portion with high display quality.

Embodiment 7

In this embodiment, examples of a semiconductor wafer, an IC chip, and an electronic component each including the semiconductor device 10*a* described in Embodiment 1 are described with reference to FIGS. 19A and 19B and FIGS. 20A and 20B.

<Semiconductor Wafer and Chip>

Figure 19A:
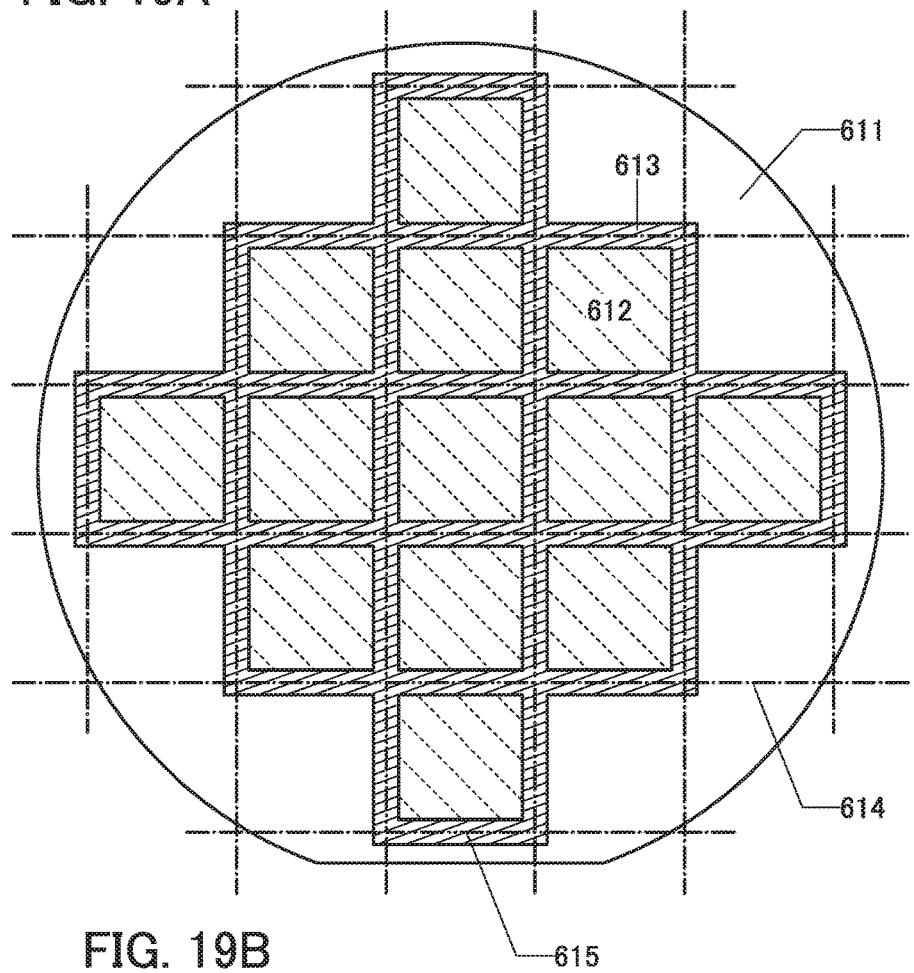
FIGS. 19A and 19B are top views of a semiconductor wafer.

FIG. 19A is a top view illustrating a substrate 611 before dicing treatment. As the substrate 611, a semiconductor substrate (also referred to as a semiconductor wafer) can be used, for example. A plurality of circuit regions 612 are provided over the substrate 611. The semiconductor device or the like described in any of the above embodiments can be provided in the circuit region 612.

Figure 19B:
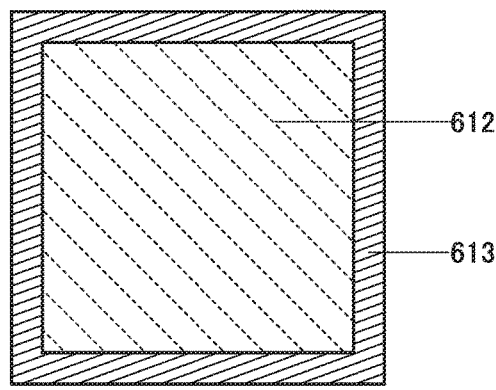

Each of the circuit regions 612 is surrounded by a separation region 613. Separation lines (also referred to as dicing lines) 614 are set at a position overlapping with the separation regions 613. Chips 615 each including the circuit region 612 can be cut from the substrate 611 by cutting the substrate 611 along the separation lines 614. FIG. 19B is an enlarged view of the chip 615.

A conductive layer or a semiconductor layer may be provided in the separation regions 613. Providing a conductive layer or a semiconductor layer in the separation regions 613 relieves ESD that might be caused in a dicing step, which prevents a decrease in yield of the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 613 allows a reduction in the usage of pure water. Therefore, the cost of manufacturing semiconductor devices can be reduced. In addition, semiconductor devices can be manufactured with improved productivity.

For a semiconductor layer provided in the separation regions 613, it is preferable to use a material having a bandgap greater than or equal to 2.5 eV and less than or equal to 4.2 eV, preferably greater than or equal to 2.7 eV and less than or equal to 3.5 eV. The use of such a material makes accumulated charge to be released slowly; thus, rapid movement of charge due to ESD can be suppressed and electrostatic breakdown is less likely to occur.

<Electronic Component>

Figure 20A:
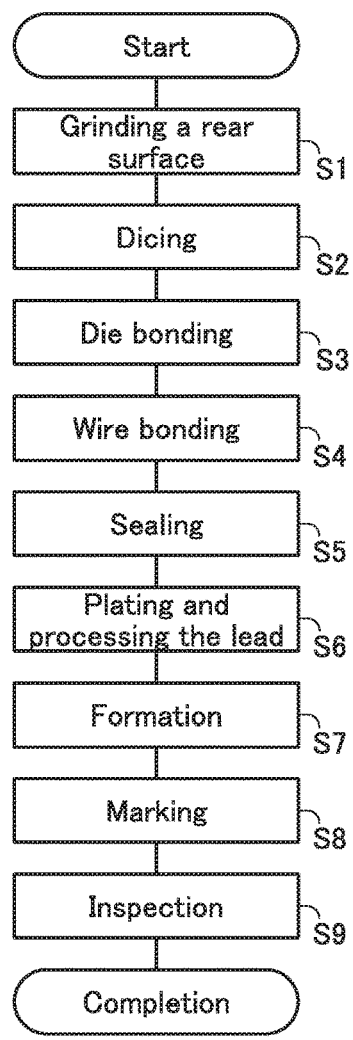
FIG. 20A is a flow chart illustrating fabrication steps of a semiconductor device.
Figure 20B:
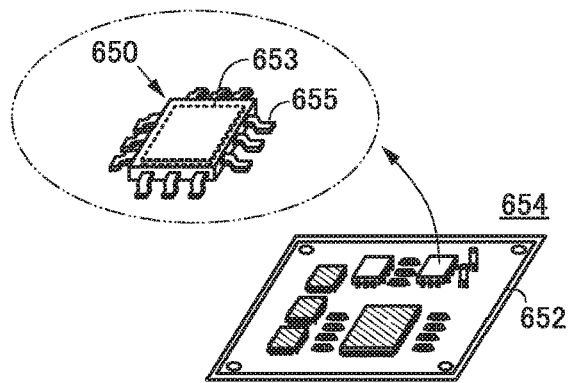
FIG. 20B is a perspective schematic view of the semiconductor device.

FIGS. 20A and 20B show an example where the chip 615 is used for an electronic component. Note that an electronic component is also referred to as a semiconductor package or an IC package. The electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process is described with reference to a flow chart in FIG. 20A. After an element substrate including the semiconductor device described in any of the above embodiments is completed in a wafer process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips in a dicing step (Step S2). Then, the divided chips are separately picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer instead of the lead frame.

Next, a wire bonding step for electrically connecting a lead of the lead frame and an electrode on the chip through a metal fine line (wire) is performed (Step S4). As the metal fine line, a silver line or a gold line can be used. Ball bonding or wedge bonding can be used as the wire bonding.

The wire-bonded chip is subjected to a sealing step (molding step) of sealing the chip with an epoxy resin or the like (Step S5). Through the sealing step, the inside of the electronic component is filled with a resin, so that a circuit portion incorporated in the chip and wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating step prevents rust of the lead and facilitates soldering for mounting the chip on a printed circuit board in a later step. Then, the lead is cut and processed in a formation step (Step S7).

Next, a printing (marking) step is performed on a surface of the package (Step S8). After a testing step (Step S9) for checking whether an external shape is good and whether there is malfunction, for example, the electronic component is completed.

FIG. 20B is a perspective schematic diagram of a completed electronic component. FIG. 20B is a perspective schematic diagram illustrating a quad flat package (QFP) as an example of the electronic component. An electronic component 650 in FIG. 20B includes a lead 655 and a semiconductor device 653. As the semiconductor device 653, the semiconductor device described in any of the above embodiments can be used.

The electronic component 650 in FIG. 20B is mounted on a printed circuit board 652, for example. A plurality of electronic components 650 are used in combination and electrically connected to each other over the printed circuit board 652; thus, a circuit board 654 on which the electronic components are mounted is completed. The completed circuit board 654 is provided in an electronic device or the like.

In this specification and the like, ordinal numbers such as "first," "second," and "third" are used in order to avoid confusion among components. Thus, the terms do not limit the number or order of components. In this specification and the like, a "first" component in one embodiment can be referred to as a "second" component in other embodiments or claims. Alternatively, in this specification and the like, a "first" component in one embodiment can be omitted in other embodiments or claims.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other as appropriate. The voltage refers to a potential difference from a reference potential. When the reference potential is a ground potential, for example, voltage can be replaced with a potential. The ground potential does not necessarily mean 0 V. Potentials are relative values, and a potential supplied to a wiring or the like is sometimes changed depending on the reference potential.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases.

In this specification and the like, a switch is conducting or not conducting (is turned on or off) to determine whether current flows therethrough or not. Alternatively, a switch has a function of selecting and changing a current path. Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected to each other in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial No. 2016-041957 filed with Japan Patent Office on Mar. 4, 2016, the entire contents of which are hereby incorporated by reference.

What is claimed is:

1. A semiconductor device comprising:
an error amplifier;
a voltage controlled oscillator;
a counter;
a first circuit; and
a terminal,
wherein the terminal is electrically connected to a non-inverting input terminal of the error amplifier,
wherein an inverting input terminal of the error amplifier is supplied with first voltage, wherein an output terminal of the error amplifier is electrically connected to an input terminal of the voltage controlled oscillator, wherein an output terminal of the voltage controlled oscillator is electrically connected to the counter, wherein the first circuit is electrically connected to the output terminal of the voltage controlled oscillator and the terminal, wherein the counter is configured to count the number of pulses of the signal and to output the number of the pulses, wherein the first circuit comprises a second circuit, a first switch, a second switch, and a capacitor, wherein the first switch is configured to control electrical continuity between the terminal and a first terminal of the capacitor, wherein the second switch is configured to control electrical continuity between the first terminal of the capacitor and a second terminal of the capacitor, and wherein the second circuit is configured to control on and off states of the first switch and the second switch.

2. A display panel comprising the semiconductor device according to claim 1,
wherein current flowing through a pixel is detected using the semiconductor device, and
wherein display data is compensated in accordance with the current flowing through the pixel.

3. A semiconductor wafer comprising the semiconductor device according to claim 1, further comprising a separation region.

4. A semiconductor device comprising:
an error amplifier;
a voltage controlled oscillator;
a counter;
a first circuit; and
a terminal,
wherein the terminal is electrically connected to a non-inverting input terminal of the error amplifier,
wherein an inverting input terminal of the error amplifier is supplied with first voltage,
wherein an output terminal of the error amplifier is electrically connected to an input terminal of the voltage controlled oscillator, wherein an output terminal of the voltage controlled oscillator is electrically connected to the counter, wherein the first circuit is electrically connected to the output terminal of the voltage controlled oscillator and the terminal, wherein the first circuit is configured to supply current through the terminal in accordance with a frequency of a signal output from the voltage controlled oscillator, wherein the counter is configured to count the number of pulses of the signal and to output the number of the pulses, wherein the first circuit comprises a second circuit, a first switch, a second switch, and a capacitor, wherein the first switch is configured to control electrical continuity between the terminal and a first terminal of the capacitor, wherein the second switch is configured to control electrical continuity between the first terminal of the capacitor and a second terminal of the capacitor, wherein the second circuit is configured to control on and off states of the first switch and the second switch, wherein the second switch is off when the first switch is on, and wherein the first switch is off when the second switch is on.

5. A display panel comprising the semiconductor device according to claim 4,
wherein current flowing through a pixel is detected using the semiconductor device, and
wherein display data is compensated in accordance with the current flowing through the pixel.

6. A display module comprising the display panel according to claim 4 and a touch panel.

7. An electronic device comprising the display panel according to claim 4, further comprising at least one of an operation button, a speaker, and a microphone.

8. A semiconductor wafer comprising the semiconductor device according to claim 4, further comprising a separation region.

* * * * *